US008674869B2

(12) United States Patent
Noguchi

(10) Patent No.: US 8,674,869 B2
(45) Date of Patent: Mar. 18, 2014

(54) A/D CONVERSION CIRCUIT

(75) Inventor: Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 35 days.

(21) Appl. No.: 13/574,513

(22) PCT Filed: Jan. 21, 2011

(86) PCT No.: PCT/JP2011/051069
§ 371 (c)(1),
(2), (4) Date: Jul. 20, 2012

(87) PCT Pub. No.: WO2011/090155
PCT Pub. Date: Jul. 28, 2011

(65) Prior Publication Data
US 2012/0286986 A1    Nov. 15, 2012

(30) Foreign Application Priority Data
Jan. 22, 2010    (JP) .................................. 2010-012100

(51) Int. Cl.
*H03M 1/44*    (2006.01)
(52) U.S. Cl.
USPC .......................................... 341/163; 341/161
(58) Field of Classification Search
USPC .......................................... 341/161, 162, 163
See application file for complete search history.

(56) References Cited

U.S. PATENT DOCUMENTS

| 5,181,035 A | 1/1993 | Mouret |
| 5,283,583 A * | 2/1994 | Ichihara ........................ 341/162 |
| 5,640,163 A | 6/1997 | Nauta et al. |
| 2008/0266163 A1* | 10/2008 | Poulton .......................... 341/161 |

FOREIGN PATENT DOCUMENTS

| JP | 4-234227 A | 8/1992 |
| JP | 8-195678 A | 7/1996 |
| JP | 9-502856 A | 3/1997 |

OTHER PUBLICATIONS

Vorenkamp et al., A 12-b, 60-MSample/s Cascaded Folding and Interpolating ADC, IEEE Journal of Solid-State Circuits, vol. 32, No. 12, Dec. 1997, pp. 1876-1886.*
Yun-Ti Wang et al., "An 8-Bit 150-MHz CMOS A/D Converter", IEEE Journal of Solid-State Circuits, Mar. 2000, pp. 308-317, vol. 35, No. 3.
European Search Report dated Jul. 3, 2013 issued by the European Patent Office in counterpart European Application No. 11734761.7.
Venes A GW et al., "An 80-MHZ, 80-MW, 8-B CMOS Folding A/D Converter With Distributed Track-and-Hold Preprocessing", IEEE Journal of Solid-State Circuits, IEEE Service Center, Piscataway, NJ, USA, vol. 31, No. 12, Dec. 1, 1996, pp. 1846-1853, XP000691801.

* cited by examiner

Primary Examiner — Howard Williams
(74) Attorney, Agent, or Firm — Sughrue Mion, PLLC

(57) ABSTRACT

Each of cascade-connected one-bit A/D converters includes first and second amplifier circuits receiving first and second input signals, a third amplifier circuit that outputs an interpolation value of outputs of the first and second amplifier circuits, a comparator that outputs a binary signal having value determined by a polarity of an output of the third amplifier circuit, and a selector that selects two of three outputs of the first to third amplifier circuits, based on a value of the comparator. The selector is set such that direct-current transfer characteristics of two outputs of the selector are folded and symmetrical relative to the midpoint of the first and second input signals.

14 Claims, 13 Drawing Sheets

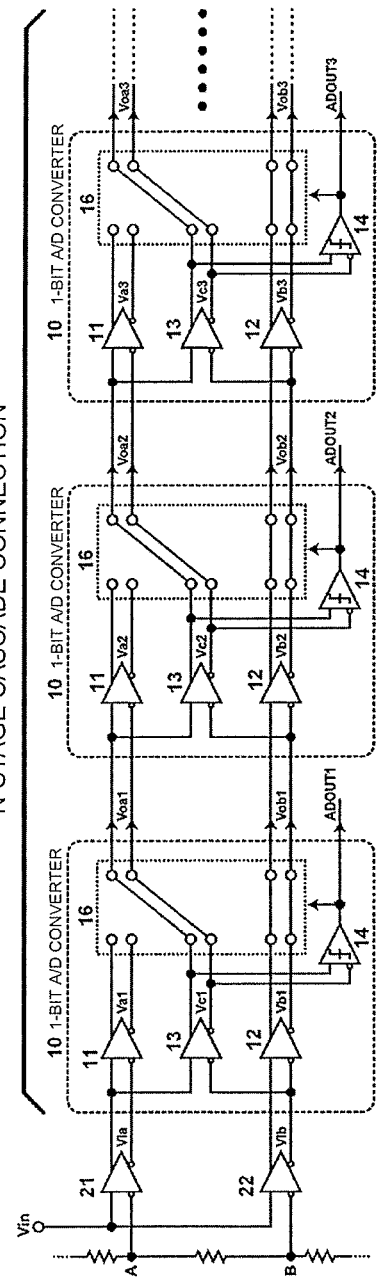

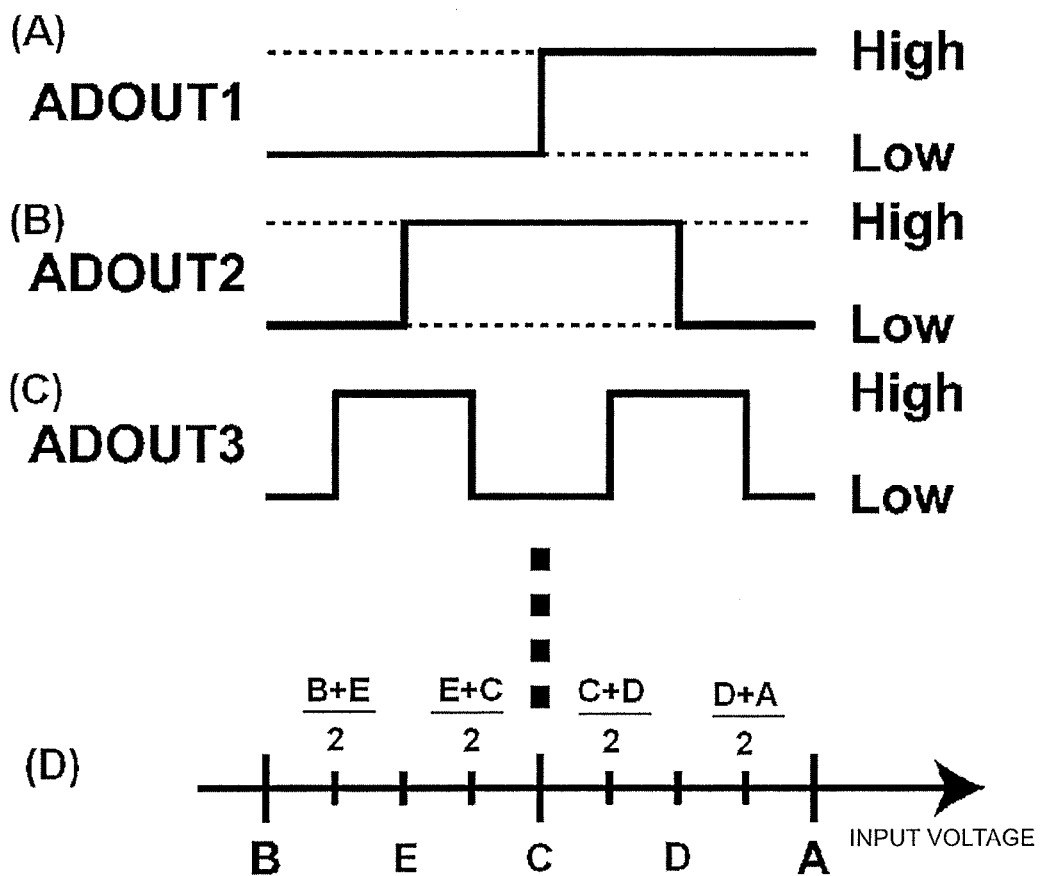

US 8,674,869 B2

A/D CONVERSION CIRCUIT

CROSS REFERENCE TO RELATED APPLICATION

This application is a National Stage of International Application No. PCT/JP2011/051069 filed Jan. 21, 2011, claiming priority based on Japanese Patent Application No. 2010-012100 filed Jan. 22, 2010, the contents of all of which are incorporated herein by reference in their entirety.

RELATED APPLICATION

The present invention is based upon and claims the benefit of the priority of Japanese Patent Application No. 2010-012100 (filed on Jan. 22, 2010), the disclosure of which is incorporated herein in its entirety by reference.

TECHNICAL FIELD

The present invention relates to an A/D conversion circuit that converts an analog signal to a digital signal.

BACKGROUND

Recently, with a development of digital technology, a demand for a higher-speed operation, lower power consumption, and downsizing of an A/D conversion circuit that converts an analog signal to a digital signal has more and more increased. As an A/D conversion circuit that implements high-speed and low-power A/D conversion, there is known a circuit configuration where a plurality of stages of one-bit flash-type A/D converters (including a small number of amplifier circuits, comparators, and selectors) are connected to obtain desired accuracy and resolution (number of bits) (refer to Non-patent Document 1, for example).

FIG. 9 is a diagram for explaining the related art described in Non-patent Document 1. FIG. 9 illustrates an overall configuration (represented by first three stages) of a circuit where a plurality of stages (N stages) of one-bit A/D converters 10', each including differential amplifier circuits 11 to 14, a comparator 14, and a selector 15, are cascade-connected. FIG. 9 is prepared by the inventor of the present invention in order to explain the related art.

FIG. 10 is a diagram for explaining a configuration of the one-bit A/D converter 10' (of each stage having the same configuration) in FIG. 9. FIG. 10 illustrates the configuration of a first stage.

FIGS. 11A and 11B are graphs for explaining direct-current (DC) transfer characteristics (input-output characteristics of input voltage versus output voltages) of an output Va of the amplifier circuit 11, an output Vb of the amplifier circuit 12, and an output Vc of the amplifier circuit 13 of the one-bit A/D converter 10' in FIG. 10 with respect to the input voltage, and an output ADOUT of the comparator. FIG. 11C is a graph explaining DC transfer characteristics of outputs Voa and Vob of the selector 15. In FIGS. 11A and 11C, a horizontal axis (X axis) indicates an input voltage, and a vertical axis (Y axis) indicates an output voltage. FIGS. 11D and 11E are graphs showing selection states of the selector 15. FIGS. 10 and 11A, 11B, 11C, 11D, and 11E are all prepared by the inventor of the present invention in order to explain the related art.

Referring to FIG. 10, a first preamplifier circuit 21 that differentially receives an input signal voltage Vin and a reference voltage A (voltage at a tap A of a ladder resistor) for differential amplification and a second preamplifier circuit 22 that differentially receives the input signal voltage Vin and a reference voltage B (voltage at a tap B of the ladder resistor) for differential amplification are disposed in an immediately preceding stage of the A/D converter 10' in the first stage.

The one-bit A/D converter 10' in the first stage includes:
a first amplifier circuit 11 that differentially receives and differentially amplifies a differential output Via of the first preamplifier circuit 21;
a second amplifier circuit 12 that differentially receives and differentially amplifies a differential output Vib of the second preamplifier circuit 22;
a third amplifier circuit 13 (also referred to as an "interpolating amplifier circuit") that differentially receives a non-inverting input of the first amplifier circuit 11 and an inverting input of the second amplifier circuit 12, and differentially amplifies the received signals;
a comparator 14 that differentially receives a differential output Vc of the third amplifier circuit 13 to output a result of comparison as a binary logic signal (digital signal); and
a selector 15 that respectively receives three differential outputs of the differential output Va of the first amplifier circuit 11, the differential output Vb of the second amplifier circuit 12, and the differential output Vc of the third amplifier circuit 13 at first to third differential input terminals thereof, and then selects and outputs two (e.g., the outputs Vc and Vb or the outputs Va and Vc as shown in FIGS. 11D and 11E) of the three differential outputs (Va, Vb, Vc) at first and second differential output terminals thereof.

The first preamplifier circuit 21 differentially receives the input signal voltage $Vin = V_{CMA} + (Vin - VA)/2$ at a non-inverting input terminal thereof and a voltage $VA = V_{CMA} - (Vin - VA)/2$ at an inverting input terminal thereof (input terminal with a circle), where $V_{CMA}$ is a midpoint voltage between the input voltage Vin and the voltage VA at the tap A and is given by $V_{CMA} = (Vin + VA)/2$. The first preamplifier circuit 21 differentially outputs a voltage $V_{CMAO} + Via/2$ (where $V_{CMAO}$ is a midpoint voltage between differential outputs) at a non-inverting output terminal thereof and a voltage $V_{CMAO} - Via/2$ at an inverting output terminal thereof (output terminal with a circle). A difference voltage between these differential outputs is given as follows: $(V_{CMAO} + Via/2) - (V_{CMAO} - Via/2) = Via$.

The second preamplifier circuit 22 differentially receives the input voltage $Vin = V_{CMB} + (Vin - VB)/2$ at a non-inverting input terminal thereof and a voltage $VB = V_{CMB} - (Vin - VB)/2$ at an inverting input terminal thereof (input terminal with a circle), where $V_{CMB}$ indicates a midpoint voltage between the input voltage Vin and the voltage VB at the tap B and is given by $V_{CMB} = (Vin + VB)/2$. Then, the first preamplifier circuit 21 differentially outputs from a non-inverting output terminal thereof a voltage $V_{CMBO} + Vib/2$ (where $V_{CMBO}$ indicates a midpoint voltage between differential outputs) and outputs from an inverting output terminal (output terminal with a circle) a voltage $V_{CMBo} - Vib/2$. A difference voltage between these differential outputs is given as follows: $(V_{CMBo} + Vib/2) - (V_{CMBo} - Vib/2) = Vib$. The first and second preamplifier circuits 21 and 22 have the same configuration.

The first amplifier circuit 11 differentially receives the differential signal Via ($V_{CMI1} + Va/2$, $V_{CMI1} - Va/2$) from the first preamplifier circuit 21, and differentially amplifies the received signal to output first differential signals $V_{CM1O} + Va/2$, $V_{CM1O} - Va/2$. A difference voltage between the first differential signals is given as follow: $(V_{CM1O} + Va/2) - (V_{CM1O} - Va/2) = Va$. $V_{CM1I}$ and $V_{CM1O}$ respectively are midpoint voltages (common-mode voltages) of the differential input signals and the differential output signals of the first amplifier circuit 11.

The second amplifier circuit 12 differentially receives the differential signal Vib (differential signals: $V_{CM2I}$+Vib/2, $V_{CM2I}$−Vib/2) from the second preamplifier circuit 22, and differentially amplifies the received signal to output second differential signals $V_{CM2O}$+Vb/2, $V_{CM2O}$−Vb/2 (a differential voltage Vb). A difference voltage between the second differential signals is given as follows: ($V_{CM2O}$+Vb/2)−($V_{CM2O}$−Vb/2)=Vb. $V_{CM2I}$ and $V_{CM2O}$ respectively are midpoint voltages (common-mode voltages) of the differential input signals and the differential output signals of the second amplifier circuit 12.

The third amplifier circuit 13 differentially receives the non-inverting output $V_{CM1O}$+Va/2 from the first amplifier circuit 11 and the inverting output $V_{CM2O}$−Vb/2 from the second amplifier circuit 12 (a differential voltage: (Va+Vb)/2, and differentially amplifies received signals to output differential signals $V_{CM3O}$+Va/2 and $V_{CM3O}$−Vb/2. A difference voltage between the differential outputs is given as follows: ($V_{CM3O}$+Va/2)−($V_{CM3O}$−Vb/2)=(Va+Vb)/2, where $V_{CM3O}$ is a midpoint voltage (common-mode voltage) of the differential output signals of the third amplifier circuit 13. Since the third amplifier circuit 13 outputs an intermediate voltage obtained by interpolating the voltages Va and Vb (internal division with an internal division ratio of 1:1), the third amplifier circuit 13 is referred to as the "interpolating amplifier circuit". In the example shown in FIG. 10, the first amplifier circuit 11, the second amplifier circuit 12, and the third amplifier circuit 13 have the same configuration to one another.

FIG. 10 shows the one-bit A/D converter 10' in the first stage. The first amplifier circuit 11 and the second amplifier circuit 12 of each one-bit A/D converter 10' in each stage after a second stage differentially receive a first differential output Voa from first differential output terminals and a second differential output Vob from second differential output terminals in the selector 15 of the one-bit A/D converter 10' in the immediately preceding stage, respectively, as shown in FIG. 9.

The comparator 14 differentially receives the differential signals from the third amplifier circuit 13 to output a High/Low level as an output ADOUT, which is a logic value signal, according to a polarity of the differential voltage Vc between the differential signals from the third amplifier circuit 13.

When the output ADOUT of the comparator 14 is Low, the selector 15 selects the differential output Vc of the third amplifier circuit 13 and the differential output Vb of the second amplifier circuit 12, and respectively outputs the differential outputs Vc and the differential outputs Vb as the first differential output Voa and the second differential output Vob (as shown in FIG. 11D).

When the output ADOUT of the comparator 14 is High, the selector 15 selects the differential output Va of the first amplifier circuit 11 and the differential output Vc of the third amplifier circuit 13, and respectively outputs the differential outputs Va and Vc as the first differential output Voa and the second differential output Vob (as shown in FIG. 11E).

As shown in FIG. 11A, the first differential output voltage Va of the first amplifier circuit 11 and the second differential output voltage Vb of the second amplifier circuit 12 have DC transfer characteristics (indicated by a dashed-dotted line and a broken line) respectively having different zero-cross points A and B. The differential output voltage Vc of the third amplifier circuit 13 has a DC transfer characteristic (indicated by a solid line) having a zero-cross point at a midpoint C between the points A and B. As shown in FIG. 11A, the third amplifier circuit 13 outputs an interpolated value between the voltages Va and Vb (intermediate value Vc=Va+Vb)/2 in this example), as the voltage Vc.

In the one-bit A/D converter 10', the polarity of the differential output voltage Vc of the third amplifier circuit 13 is decided by the comparator 14, and an input voltage to the A/D converter 10' is distinguished between two levels (segments) ([A−C], [C−B]) using the midpoint C as a boundary.

As described before, the selector 15 selects the differential output voltages Vc and Vb or Va and Vc among the three differential output voltages Va, Vb, and Vc to output as the first differential output Voa and the second differential output Vob, according to a value of the output ADOUT of the comparator 14. The DC transfer characteristics (direct-current transfer characteristics of output voltages with respect to input voltage) as shown in FIG. 11C are thereby obtained.

Referring to FIG. 11C, the first differential output Voa of the selector 15 (a dashed-dotted line) is the output Vc in FIG. 11A when the input voltage is less than or equal to a voltage at the midpoint C of a segment between the points A and B, and is zero when the input voltage is the voltage at the midpoint C (zero-cross point). When the input voltage is larger than the voltage at the point C, the output Vc in FIG. 11A is positive, and the output ADOUT is High. Thus, the output Va in FIG. 11A is output as the first differential output Voa of the selector 15. The first differential output Voa of the selector 15 changes to a negative value from zero at the point C, and becomes discontinuous at the point C. The second differential output Vob of the selector 15 (a broken line) is the output Vb in FIG. 11A when the input voltage has a voltage value less than or equal to the voltage at the midpoint C of the segment between the points A and B. When the input voltage becomes larger than the voltage at the point C, the output Vc in FIG. 11A becomes positive, and the output ADOUT goes High. For this reason, the output Vc in FIG. 11A is output as the second differential output Vob of the selector 15, and the output Vob changes from a positive value to zero at the point C, and becomes discontinuous at the point C.

By cascade-connecting N stages of the one-bit A/D converters as shown in FIG. 9, using the one-bit A/D converters 10' described with reference to FIGS. 10 and 11 as a unit circuit, an N-bit A/D conversion circuit is formed. Then, differential output signals Van, Vbn, and Vcn (n=1, 2, 3, ..., N) and an N-bit digital signal ADOUT n (n=1, 2, 3, ... N) as shown in FIGS. 12B to 12G can be obtained.

FIGS. 12B and 12C are graphs illustrating DC transfer characteristics (relationships between an input voltage and each of an output voltage Va1 of the amplifier circuit 11, an output voltage Vb1 of the amplifier circuit 12, and an output voltage Vc1 of the amplifier circuit 13) in the one-bit A/D converter 10' in a first stage in FIG. 12A and a signal waveform of an output ADOUT1 of the comparator 14 of the one-bit A/D converter 10' in the first stage. FIGS. 12B and 12C correspond to FIGS. 11A and 11B. The output ADOUT1 of the comparator 14 that receives the output voltage Vc1 is Low when Vc1<=0, and is High when Vc1>0. When the input voltage becomes less than or equal to a voltage at a point C (Vc1<=0), the output ADOUT1 goes Low. When the input voltage becomes greater than or equal to the voltage at the point C (Vc1>=0), the output ADOUT1 is High.

FIGS. 12D and 12E are graphs illustrating DC transfer characteristics (of output voltages Va2, Vb2, and Vc2 with respect to the input voltage) in the one-bit A/D converter 10' in FIG. 12A in a second stage and a signal waveform of an output ADOUT2 of the comparator 14 of the one-bit A/D converter 10' in the second stage. FIG. 12D corresponds to FIG. 11C. The output ADOUT2 of the comparator 14 that receives the output voltage Vc2 is Low when Vc2≤0, and is High when Vc2>0. When the input voltage becomes less than or equal to a voltage at a midpoint E between the points B and C, the output ADOUT2 is Low. When the input voltage is in a range between the point C and the point E, the output ADOUT2 is High. The output ADOUT2 is Low when the input voltage is in a range between the point C and a midpoint D of the point C and the point A. When the input voltage is greater than or equal to a voltage at the point D, the output ADOUT2 is High.

FIGS. 12F and 12G are graphs illustrating DC transfer characteristics (output voltages Va3, Vb3, and Vc3 with respect to the input voltage) in the one-bit A/D converter 10' in FIG. 12A in a third stage and a signal waveform of an output ADOUT3 of the comparator 14 of the one-bit A/D converter 10' in the third stage. The output ADOUT3 of the comparator 14 that receives the output voltage Vc3 is Low when Vc3<=0, and is High when Vc3>0. When the input voltage is less than or equal to a voltage at the midpoint between points B and E, the output AOUT 3 is Low. When the input voltage is in a range between the point E and the midpoint between the point B and the point E, the output ADOUT3 is High. When the input voltage is in a range between the point E and the midpoint between the points E and C, the output ADOUT3 is Low. When the input voltage is in a range between the point C and the midpoint between the points E and C, the output ADOUT3 is High. When the input voltage is in a range between the point C and the midpoint between the point C and the point D (midpoint between the points A and C), the output ADOUT3 is Low. When the input voltage is in a range between the point D and the midpoint between the points C and D, the output ADOUT3 is High. When the input voltage is in a range between the point D and the midpoint between the point A and the point D, the output ADOUT3 is Low. When the input voltage is equal to or higher than a voltage at the midpoint between the points D and A, the output ADOUT3 is High.

As shown in FIGS. 12B, 12D, and 12F, the one-bit A/D converter 10' in each stage has a DC transfer characteristic of an output differential voltage Vcn (n=1, 2, 3, . . . N) such that zero-cross points of the DC transfer characteristic equally divides a segment A–B by $2^n$ (n powers of 2).

As shown in FIG. 12B, for example, the output differential voltage Vc1 has one zero-cross point at the point C and equally divides the input voltage segment A–B by two. The output differential voltage Vc2 has three zero-cross points of the points E, C, and D, and equally divides the input voltage segment A–B by $2^2=4$ as shown in FIG. 12D. The output differential voltage Vc3 has a total of seven zero-cross points which are the midpoint between the points B and E, the point E, the midpoint between the points E and C, the point C, the midpoint between the points C and D, the point D, and the midpoint between the points D and A, and these zero-cross points equally divide the input voltage segment A–B by $2^3=8$.

When the output ADOUTn (n=1, 2, . . . , N) being the output of the comparator 14 of the one-bit A/D converter 10' in each stage is set to constitute the N-bit digital signal, a N-bit binary code as shown in FIG. 13(A) to (D) is obtained. FIG. 13(A) to (D) show a relationship between each of outputs ADOUT1 to ADOUT3 and the input voltage. The output ADOUT1 corresponds to an MSB (Most Significant Bit), and an output ADOUTN corresponds to an LSB (Least Significant Bit).

The following describes a code of the outputs ADOUT1, ADOUT2, and ADOUT3 of a three-bit digital signal, in case N is set to 3 and the input voltage segment A–B is equally divided by $2^3=8$. It is assumed that D=(A+C)/2 and E=(B+C)/2.

(1) In case an input voltage Vin is greater than or equal to a voltage at a point (A+D)/2, (ADOUT1, ADOUT2, ADOUT3)=(1, 1, 1);
(2) In case the input voltage Vin is in a voltage segment [D, (A+D)/2], (ADOUT1, ADOUT2, ADOUT3)=(1, 1, 0);
(3) In case the input voltage Vin is in a voltage segment [(C+D)/2, D], (ADOUT1, ADOUT2, ADOUT3)=(1, 0, 1);
(4) In case the input voltage Vin is in a voltage segment [C, (C+D)/2], (ADOUT1, ADOUT2, ADOUT3)=(1, 0, 0);
(5) In case the input voltage Vin is in a voltage segment [(E+C)/2, C], (ADOUT1, ADOUT2, ADOUT3)=(0, 1, 1);
(6) In case the input voltage Vin is in a voltage segment [E, (E+C)/2], (ADOUT1, ADOUT2, ADOUT3)=(0, 1, 0);
(7) In case the input voltage Vin is in a voltage segment [(B+E)/2, E], (ADOUT1, ADOUT2, ADOUT3)=(0, 0, 1);
(8) In case the input voltage Vin is less than or equal to a voltage at a point (B+E)/2, (ADOUT1, ADOUT2, ADOUT3)=(0, 0, 0).

By (cascade) connecting a plurality (N) of stages of the one-bit A/D converters 10' in cascade as described above,
An N-bit A/D conversion circuit can be configured where the output ADOUT1 of the one-bit A/D converter 10' in a first stage is set to the MSB and the output ADOUTN of the one-bit A/D converter 10' in an Nth stage is set to the LSB.

The following describes Patent Documents 1 and 2 found by prior art document search conducted by the applicant of the present invention. Patent Document 1 discloses an A/D converter where a plurality of stages of pipe line cells are cascade-connected. Each pipeline cell includes a sample and hold circuit that samples and holds a signal in an immediately preceding stage, a comparator that compares an output of the sample and hold circuit with a comparison reference signal, and a subtractor that subtracts a subtraction signal from the output of the sample and hold circuit. Patent Document 2 discloses an A/D converter with a folding architecture where an input signal is folded by folding stages, a folded signal obtained by the folding has four upward edges and four downward edges, and an amplitude range of the folded signal is reduced to one eighth of an amplitude range of the input signal. While 256 comparators are necessary for a flash-type A/D converter, the number of comparators necessary for the A/D converter with the folding architecture is reduced to 32. Patent Document 1 and 2 do not disclose or suggest recognition of a problem of the A/D conversion circuit described with reference to FIGS. 9 to 12 (which will be described below) and means for solving the problem.

[Patent Document 1] JP Patent Kokai Publication No. JP-A-08-195678
[Patent Document 2] JP Patent Kokai Publication No. JP-A-09-502856
[Non-patent Document 1] Yun-Ti Wang and Behzad Razavi, "An 8-Bit 150-MHz CMOS A/D Converter", IEEE JOURNAL OF SOLID-STATE CIRCUITS, VOL. 35, NO. 3, MARCH 2000

SUMMARY

The following describes an analysis of the related arts.
In the A/D conversion circuit shown in FIG. 9, the DC transfer characteristic (input-output characteristic) of the one-bit A/D converter 10 in each stage has discontinuous characteristic having a shape like a saw-tooth wave with respect to the input voltage, as illustrated in FIGS. 11C, 12D, and 12F. When the input voltage exceeds the voltage indicated by the point C in a direction from the point B to the point A, the output Voa indicated by the dashed-dotted line discontinuously varies from 0 to a negative value at the point C, and the output Vob indicated by the broken line discontinuously varies from a positive value to 0 at the point C in FIG. 11C.

FIG. 12D is a graph showing characteristics of the output voltage Va2 of the first amplifier circuit 11, the output voltage Vb2 of the second amplifier circuit 12, and the output voltage Vc2 of the third amplifier circuit 13 of the one-bit A/D converter 10' in the second stage with respect to the input voltage. When the input voltage exceeds the voltage at the point C in the direction from the point B to the point A, the output Va2 indicated by a dashed-dotted line reaches 0 at the point C from a negative value, varies discontinuously to a negative value, rises again, and then zero-crosses at the point A. The output Vb2 indicated by a broken line zero-crosses at the point B, rises, varies discontinuously from a positive value to 0 at the point C, and then rises again. The output Vc2 indicated by a solid line zero-crosses at the point E, rises, varies discontinuously from a positive value to a negative value at the point C, rises, and then zero-crosses at the point D.

FIG. 12F is a graph showing characteristics of the output voltage Va3 of the first amplifier circuit 11, the output voltage Vb3 of the second amplifier circuit 12, and the output voltage Vc3 of the third amplifier circuit 13 of the one-bit A/D converter 10' in the third stage with respect to the input voltage. When the input voltage exceeds the voltage at the point C in the direction from the point B to the point A, the output Va3 indicated by a dashed-dotted line varies discontinuously from 0 to a negative value at the point E (=(B+C)/2), rises again, reaches 0 at the point C, varies discontinuously from 0 to a negative value at the point C, rises again, reaches 0 at the point D (=(C+A)/2), varies discontinuously from 0 to a negative value at the point D, rises again, and zero-crosses at the point A. The output Vb3 indicated by a broken line zero-crosses at the point B, rises, varies discontinuously from a positive value to 0 at the point E, rises again, varies discontinuously from a positive value to 0 at the point C, rises again, varies discontinuously from a positive value to 0 at the point D, and rises again. The output Vc3 indicated by a solid line zero-crosses at the midpoint between the point B and the point E, varies discontinuously from a positive value to a negative value at the point E, rises again, zero-crosses at the midpoint between the point E and the point C, varies discontinuously from a positive value to a negative value at the point C, rises again, zero-crosses at the midpoint between the point C and the point D, varies discontinuously from a positive value to a negative value at the point D, rises again, and zero-crosses at the midpoint between the point D and the point A.

When there is a discontinuity (step of a high amplitude) in the DC transfer characteristic (characteristic of output voltage to input voltage) as described above, if the input voltage fluctuates in the vicinity of the discontinuity, for example, an output signal of the one-bit A/D converter 10 will greatly varies. Operation of the one-bit A/D converter 10 will therefore become unstable.

Specifically, when the input voltage fluctuates in a minute range at both sides (plus and minus sides) of one of the voltages at the points C, D, and E in FIG. 12F, for example, the output Vc3 comes and goes between positive and negative values. As a result, the output ADOUT 3, which is the LSB, fluctuates between High and Low levels, leading to an unstable operation of the one-bit A/D converter 10. Likewise, when the input voltage fluctuates in a minute range at both sides (plus and minus sides) of the voltage at the point C in FIG. 12D, the output Vc2 comes and goes between positive and negative values. As a result, the output ADOUT 2 fluctuates between High and Low levels. Further, when the input voltage fluctuates in the minute range at both sides (plus and minus sides) of the voltage at the point C, the output Vc1 also comes and goes between positive and negative values. As a result, the output ADOUT 1, which is the MSB, fluctuates between High and Low levels. After all, it may also occur that all of the outputs ADOUT1, ADOUT2, and ADOUT3 output values that are different from proper values. A problem similar to the above-mentioned problem may occur also when an input voltage to be A/D converted is a high-frequency AC signal or when a transient signal such as a single-shot pulse is A/D converted at high speed.

In a high-speed A/D conversion circuit in particular, the above-mentioned problem (unstable operation caused by discontinuity of a direct-current (DC) transfer characteristic) will be a serious problem to be overcome. Accordingly, there is expected implementation of an A/D conversion circuit capable of performing a stable operation even when a high-speed operation is performed.

The present invention has been made in view of the above-mentioned problem. It is therefore an object of the invention to provide an A/D conversion circuit that avoids an unstable operation caused by discontinuity of a direct-current transfer characteristic of the A/D conversion circuit.

According to the present invention, there is provided An A/D conversion circuit comprising N stages (N being a predetermined positive integer not less than two) of cascade-connected one-bit A/D converters each of which performs analog-to-digital conversion of an input voltage into one bit, the input voltage received in an initial one of the N stages of the one-bit A/D converters being amplified, output, and then sequentially transferred to subsequent ones of the N stages of the one-bit A/D converters to perform A/D conversion in each stage, thereby performing N-bit A/D conversion as a whole in the A/D conversion circuit. In the A/D conversion circuit, the one-bit A/D converter is configured to have a direct-current transfer characteristic folded with respect to a center voltage of the input voltage to be analog-to-digital converted. In the present invention, the one-bit A/D converter comprises:

first and second amplifier circuits that respectively receive first and second input signals as the input analog voltage of the one-bit A/D converter;

a third amplifier circuit that receives an intermediate value between the first input signal and the second input signal;

a comparator that receives an output of the third amplifier circuit to output a binary signal according to a polarity of the output of the third amplifier circuit; and a selector that selects and outputs a first set of two outputs comprising the output of the third amplifier circuit and one of outputs of the first and second amplifier circuits or a second set of two outputs comprising the output of the third amplifier circuit and the other of the outputs of the first and second amplifier circuits, from among the three outputs of the first to third amplifier circuits, as first and second output signals, using the output of the comparator as a selection control signal;

the first and second output signals output from the selector being supplied to the one-bit A/D converter in a subsequent one of the N stages as first and second input signals;

the selector outputting signals obtained by inverting polarities of the two outputs of the selected first or second set such that the direct-current transfer characteristic of the one-bit A/D converter is symmetrically folded with respect to the intermediate value between the first input signal and the second input signal. According to the present invention, a semiconductor device with the A/D conversion circuit mounted thereon is provided.

According to the present invention, an A/D conversion circuit that avoids an unstable operation caused by discontinuity of a direct-current transfer characteristic of the A/D conversion circuit can be implemented.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4A is a diagram illustrating a configuration of an A/D conversion circuit in the first example, and FIGS. 4B to 4G are graphs each showing DC transfer characteristics and an output of the comparator in each stage;

FIG. 5 (A) to (D) are diagrams explaining an A/D conversion output of the A/D conversion circuit in the first example;

PREFERRED MODES

Figure 1:
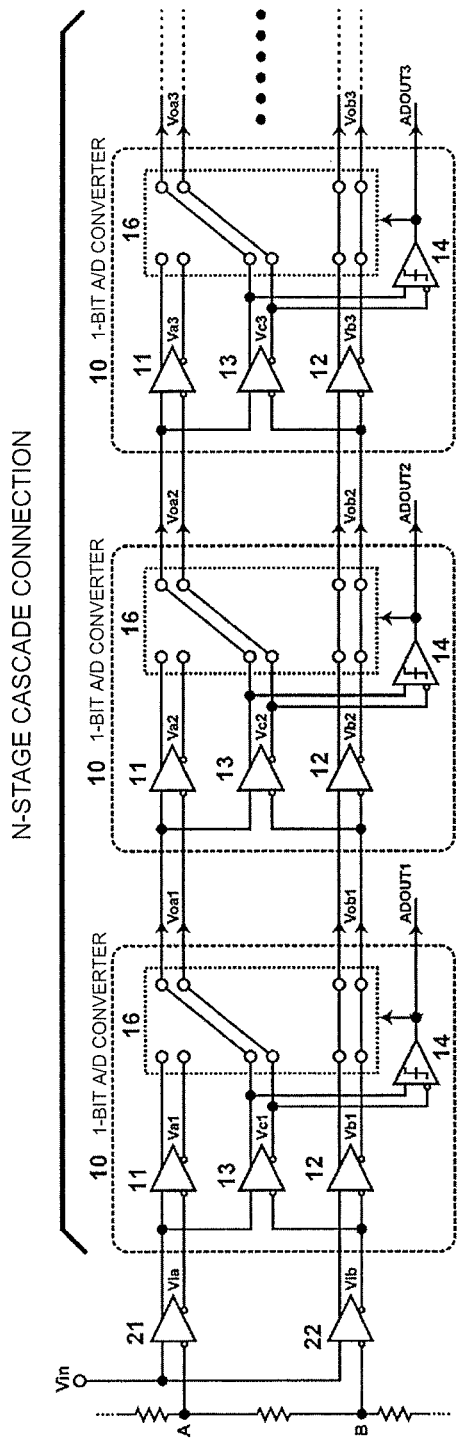
FIG. 1 is a diagram illustrating a configuration of a first example.

In aspects of the disclosure, there is provided an A/D conversion circuit comprising N stages (N being a predetermined positive integer not less than two) of one-bit A/D converter, cascade-connected, each of which performs analog-to-digital conversion of an input voltage into one bit, the input voltage received in an initial one of the N stages of the one-bit A/D converters being amplified, output, and then sequentially transferred to subsequent ones of the N stages of the one-bit A/D converters to perform A/D conversion in each of the subsequent stages, thereby performing N-bit A/D conversion as a whole in the A/D conversion circuit. The one-bit A/D converter has a direct-current transfer characteristic which is folded with respect to a center voltage of the input voltage to be analog-to-digital converted.

In aspects of the disclosure, the one-bit A/D converter comprises:

first and second amplifier circuits (11, 12) that respectively receive first and second input signals as the input analog voltage of the one-bit A/D converter;

a third amplifier circuit (13) that receives an intermediate value between the first input signal and the second input signal;

a comparator (14) that receives an output (Vc) of the third amplifier circuit to output a binary signal according to a polarity of the output (Vc) of the third amplifier circuit; and a selector (16) that selects and outputs a first set of two outputs comprising the output (Vc) of the third amplifier circuit and one of outputs of the first and second amplifier circuits or a second set of two outputs comprising the output (Vc) of the third amplifier circuit and the other of the outputs of the first and second amplifier circuits, from among the three outputs (Va, Vb, Vc) of the first to third amplifier circuits, as first and second output signals, using the output of the comparator (14) as a selection control signal;

the first and second output signals output from the selector (16) being supplied to the one-bit A/D converter in a subsequent one of the N stages as first and second input signals;

the selector (16) outputting signals obtained by inverting polarities of the two outputs of the selected first or second set such that the direct-current transfer characteristic of the one-bit A/D converter is symmetrically folded with respect to the intermediate value between the first input signal and the second input signal. The first and second output signals (Voa, Vob) output from the selector (16) are supplied as the first and second input signal of the one-bit A/D converter in the subsequent one of the N stages.

In aspects of the disclosure, the selector (16) is configured to respectively select the outputs of the third and second amplifier circuits (13, 12) as the first and second output signals when the output of the comparator assumes a first value; and to respectively select signals obtained by inverting the polarities of the outputs of the third and first amplifier circuits (13, 11) as the first and second output signals when the output of the comparator assumes a second value.

In aspects of the disclosure, it may be so arranged that respective polarities of the first and second output signals of the one-bit A/D converter remain unchanged in the vicinity of the center voltage of the input voltage, irrespective of whether the input voltage is higher or lower than the center voltage, and an output of the comparator (14) in the one-bit A/D converter in a subsequent one of the N stages of the one-bit A/D converters, which receives the output (Vc1) of the third amplifier circuit (13), is set to be same without changing a value of the output of the comparator.

In aspect of the disclosure, the selector is constituted from MOS transfer gates.

In aspects of the disclosure, the selector may comprise: first to third input terminals that respectively receive the outputs (Va, Vb, Vc) of the first to third amplifier circuits;

first and second output terminals that respectively output the first output signal and the second output signal;

a first switch (1611, 1612) and a second switch (1615, 1616) respectively inserted between the second output terminal and the first input terminal and between the second output terminal and the second input terminal; and a third switch (1617, 1618) and a fourth switch (1613, 1614) respectively inserted between the first output terminal and one of two input nodes obtained by branching the third input terminal into the two nodes and between the first output terminal and the other of the two input nodes;

turning on and off of the first and second switches may be complementarily controlled by the selection control signal and an inverted signal of the selection control signal;

turning on and off of the third and fourth switches may be complementarily controlled by the selection control signal and the inverted signal of the selection control signal;

the second and fourth switches may turn on and the first and third switches may turn off when the selection control signal assumes the first value, and the outputs (Vc, Vb) of the third and second amplifier circuits may be respectively output from the first and second output terminals as the first and second output signals; and the first and third switches may turn on and the second and fourth switches may turn off when the selection control signal assumes the second value, and a signal obtained by inverting the polarity of the output (Vc) of the third amplifier circuit and a signal obtained by inverting the polarity of the output (Va) of the first amplifier circuit may be respectively output from the first and second output terminals, as the first and second output signals.

In aspects of the disclosure, the selector may comprise a differential circuit including a plurality of stages of differential pairs cascoded between power supplies, and may switch turning on and off of a current path of each differential pair by the selection control signal.

In aspects of the disclosure, the selector may comprise:

first differential pair transistors (NM5, NM6) with sources thereof coupled in common to a current source (11) connected to a first power supply (GND), the first differential pair transistors respectively receiving the selection control signal being the output of the comparator and a complementary signal of the selection control signal at gates thereof;

second differential pair transistors (NM1, NM2) with sources thereof connected in common to a first output of the first differential pair transistors, the second differential pair transistors respectively receiving the first input signal and a complementary signal of the first input signal at gates thereof; and third differential pair transistors (NM3, NM4) with sources thereof connected in common to a second output of the first differential pair transistors, the third differential pair transistors respectively receiving the second input signal and a complementary signal of the second input signal at gates thereof;

first outputs of differential outputs of the second and third differential pair transistors may be connected to a second power supply (VDD) through a first resistance element (R1) and are output to one of differential output terminals; and second outputs of the differential outputs of the second and third differential pair transistors may be connected to the second power supply through a second resistance element (R2) and are output to the other of the differential output terminals.

In aspects of the disclosure, the A/D conversion circuit may comprise:

a track and hold circuit disposed between each output of the one-bit A/D converter in one of the N stages and an input of the one-bit A/D converter in a subsequent one of the N stages, track and hold operations of the track and hold circuit being controlled by a clock signal;

each of the cascaded one-bit A/D converters in each of the plurality of stages being pipeline-operated.

In aspects of the disclosure, an A/D conversion circuit comprises:

one-bit A/D converters cascade-connected in a plurality of stages;

each of the one-bit A/D converters comprising:

first to third differential amplifier circuits (11, 12, 13);

a comparator (14) that receives differential output signals of the third differential amplifier circuit and outputs a binary signal, based on a value of the differential output signals; and a selector (16) including first and second differential output terminals and first to third differential input terminals that differentially receive differential output signals of the first and second amplifier circuits and the differential output signals of the third amplifier circuit, respectively. When the output of the comparator (14) assumes a first value, the selector (16) respectively connects non-inverting and inverting terminals of the third differential input terminals to non-inverting and inverting terminals of the first differential output terminals, and respectively connects non-inverting and inverting terminals of the second differential input terminals to non-inverting and inverting terminals of the second differential output terminals. When the output of the comparator assumes a second value, the selector respectively connects the inverting and non-inverting terminals of the third differential input terminals to the non-inverting and inverting terminals of the first differential output terminals, and respectively connects inverting and non-inverting terminals of the first differential input terminals to the non-inverting and inverting terminals of the second differential output terminals. The first and second differential amplifier circuits (11, 12) of the one-bit A/D converter in one of the stages respectively receive differential signals from the first and second differential output terminals of the selector of the one-bit A/D converter in an immediately preceding one of the stages. The third differential amplifier circuit (13) of the one-bit A/D converter in the one of the stages differentially receives a signal at the non-inverting terminal of the first differential output terminals of the selector of the one-bit A/D converter in the immediately preceding one of the stages and a signal at the inverting terminal of the second differential output terminals of the selector of the one-bit A/D converter in the immediately preceding one of the stages. The first and second differential amplifier circuits (11, 12) in the one-bit A/D converter in an initial one of the stages differentially receive differential output signals from differential output terminals of first and second preamplifier circuits (21, 22), respectively. The third differential amplifier circuit (13) of the one-bit A/D converter in the initial one of the stages differentially receives a signal at a non-inverting terminal of the differential output terminals of the first preamplifier circuit (21) and a signal at an inverting terminal of the differential output terminals of the second preamplifier circuit (22). The first preamplifier circuit (21) differentially receives an input signal and a first reference signal. The second preamplifier circuit (22) differentially receives the input signal and a second reference signal having a potential different from a potential of the first reference signal. Output signals of the comparators of the plurality of stages of one-bit A/D converter are set to an A/D conversion result.

In aspects of the disclosure, the A/D conversion circuit may comprise:

first and second track and hold circuits (31, 32) that respectively receive and hold signals at the first and second differential output terminals of the selector of the one-bit A/D converter in one of the stages, for transfer to the one-bit A/D converter in a subsequent one of the stages when a clock signal assumes a first value.

In aspects of the disclosure, the selector may comprise:

first and second pass transistors (1611, 1612) respectively inserted between the non-inverting terminal (1601) of the first differential input terminals and the inverting terminal (1610)

of the second differential output terminals and between the inverting terminal (1602) of the first differential input terminals and the non-inverting terminal (1609) of the second differential output terminals, turning on and off of the first and second pass transistors being controlled in common by the output signal of the comparator;

third and fourth pass transistors (1615, 1616) respectively inserted between the non-inverting terminal (1605) of the second differential input terminals and the non-inverting terminal (1609) of the second differential output terminals and between the inverting terminal (1606) of the second differential input terminals and the inverting terminal (1610) of the second differential input terminals, turning on and off of the third and fourth pass transistors being controlled in common by an inverted signal of the output signal of the comparator;

fifth and sixth pass transistors (1613, 1614) respectively inserted between the non-inverting terminal (1603) of the third differential input terminals and the non-inverting terminal (1607) of the first differential output terminals and between the inverting terminal (1604) of the third differential input terminals and the inverting terminal (1608) of the first differential output terminals, turning on and off of the fifth and sixth pass transistors being controlled in common by the inverted signal of the output signal of the comparator; and seventh and eighth pass transistors (1617, 1618) respectively inserted between the inverting terminal (1604) of the third differential input terminals and the non-inverting terminal (1607) of the first differential output terminals and between the non-inverting terminal (1603) of the third differential input terminals and the inverting terminal (1608) of the first differential output terminals, turning on and off of the seventh and eighth pass transistors being controlled in common by the output signal of the comparator.

The following describes the operation principle of the present invention. Each one-bit A/D converter according to the present invention includes first and second amplifier circuits (11, 12), a third amplifier circuit (13) that outputs an interpolation value (intermediate value) of outputs of the first and second amplifier circuits, a comparator (14) that outputs a binary signal whose value is determined by the polarity of an output of the third amplifier circuit, and a selector (16) that selects two of three outputs (Va, Vb, Vc) of the first to third amplifier circuits (11~13), based on a output value of the comparator (14). In the one-bit A/D converter, a voltage segment [X−Z] or [Z−Y](where X>Y, Z=(X+Y)/2) is identified to output a 1-bit signal. The logic configuration of the selector (16) is set such that the DC transfer characteristic (direct-current transfer characteristic of output voltage with respect to input voltage) of the one-bit A/D converter is folded at the point Z and is symmetrical relative to the point Z. According to the present invention, by folding the DC transfer characteristic for each segment to be shaped like a symmetrical triangular wave with the midpoint of each segment serving as the top of the triangular wave, discontinuity (step portion) in the DC transfer characteristic, which is the problem of the related art, is resolved. An A/D conversion circuit capable of performing a high-speed and stable operation is thereby implemented.

The selector (16) may be formed by using transfer gates including MOS transistors and thus an A/D conversion circuit capable of performing a high-speed and stable operation can be thereby obtained. The selector is suitable for being mounted on a CMOS semiconductor device in which remarkably higher integration and remarkably high speed are achieved. Alternatively, by using a CML (Current Mode Logic) selector configured by switching a current source between two differential amplifier circuits for the selector (16) as well, an A/D conversion circuit capable of performing a high-speed and stable operation can be obtained.

By inserting the track and hold (T/H) circuits between the respective stages of the A/D conversion circuit, synchronizing the track and hold (T/H) circuits with the clock signal, and then sequentially pipeline-operating each stage, an A/D conversion circuit capable of performing a high-speed and stable operation can be obtained. A description will be given below in connection with examples.

FIRST EXAMPLE

Figure 2:
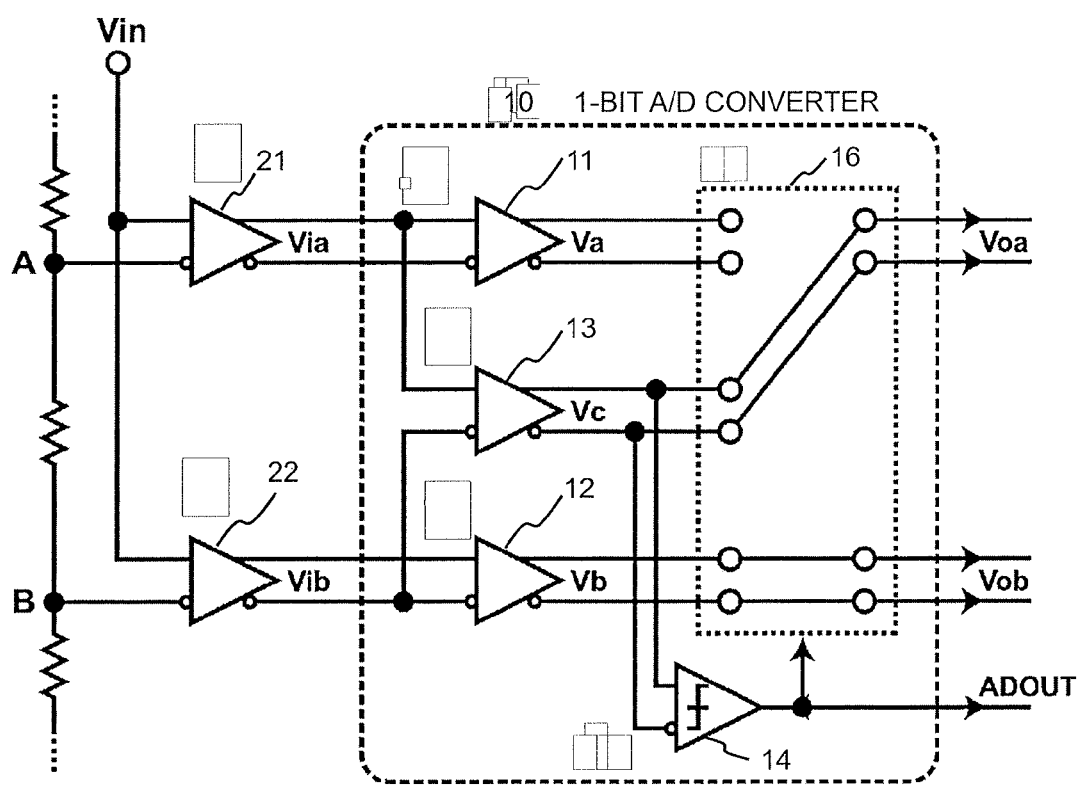
FIG. 2 is a diagram illustrating a configuration of a one-bit A/D converter in the first example.
Figure 10:
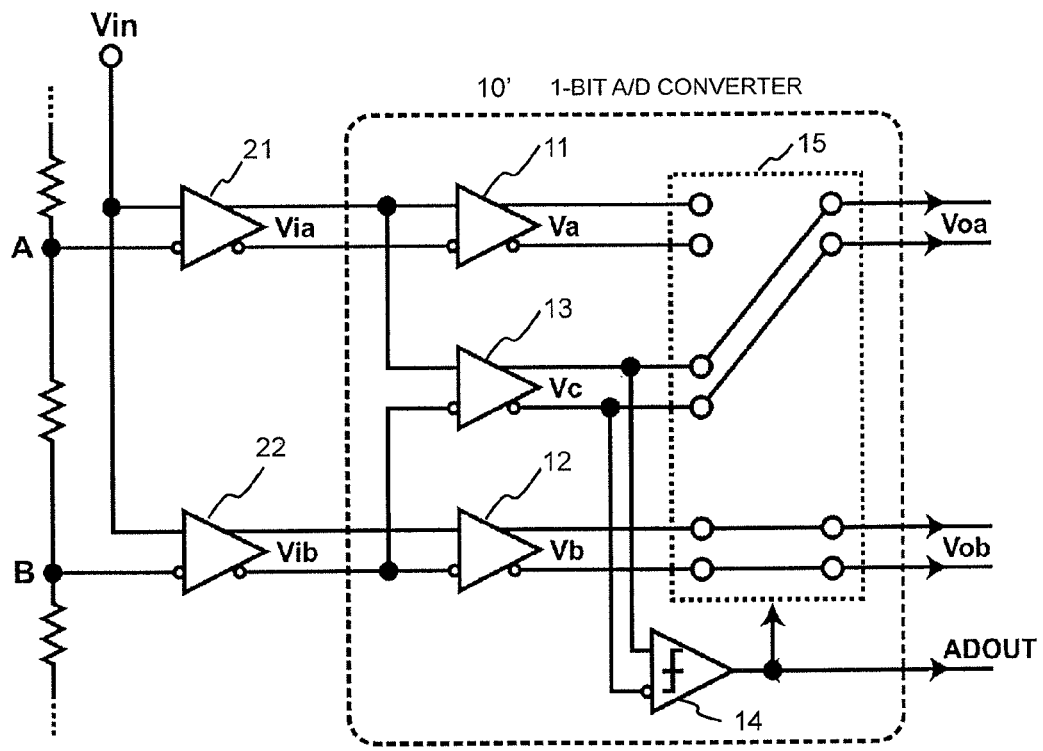
FIG. 10 is a diagram explaining a one-bit A/D converter in FIG. 9.

FIG. 1 is a diagram illustrating a configuration of a first example of the disclosure. FIG. 2 is a diagram illustrating a configuration of a one-bit A/D converter in a first stage in FIG. 1. In this example, a selector 16 of a one-bit A/D converter 10 is different from a selector 15 of a one-bit A/D converter 10' shown in FIG. 10. The other configurations in FIG. 2 are the same as those in FIG. 10. Like the one-bit A/D converter 10' in FIG. 10, the one-bit A/D converter 10 in the first stage includes a first amplifier circuit 11 that differentially receives a differential output Via of a first preamplifier circuit 21, and differentially amplifies the received signal; a second amplifier circuit 12 that differentially receives a differential output Vib of a second preamplifier circuit 22, and differentially amplifies the received signal; a third amplifier circuit 13 (also referred to as an "interpolating amplifier circuit") that differentially receives an input signal supplied to a non-inverting input terminal of the first amplifier circuit 11 and an input signal supplied to an inverting input terminal (input terminal with a circle) of the second amplifier circuit 12, and differentially amplifies the received signal; a comparator 14 that differentially receives a differential output Vc of the third amplifier circuit 13 to output a result of comparison as a binary logic signal (digital signal); and a selector 16 that respectively receives a differential output Va of the first amplifier circuit 11, a differential output Vb of the second amplifier circuit 12, and a differential output Vc of the third amplifier circuit 13 at first to third differential input terminals thereof to output selected two (e.g., the outputs Vc and Vb or an output −Vc (signal obtained by inverting a polarity of the output Vc) and an output −Va (signal obtained by inverting a polarity of the output Va) as shown in FIGS. 3D and 3E) of the three differential outputs (Va, Vb, Vc) from first and second differential output terminals thereof, according to an output ADOUT of the comparator 14, which is a result of one-bit A/D conversion.

The first preamplifier circuit 21 differentially receives an input voltage $Vin=V_{CMA}+(Vin-VA)/2$ at a non-inverting input terminal thereof and a voltage $VA=V_{CMA}-(Vin-VA)/2$ at an inverting input terminal thereof (input terminal with a circle), where $V_{CMA}$ is a midpoint voltage between the input voltage Vin and the voltage VA at a tap A, and is given by $V_{CMA}+(Vin+VA)/2$. Then, the first preamplifier circuit 21 differentially outputs a voltage $V_{CMAO}+Via/2$ (where $V_{CMAO}$ is a midpoint potential between differential outputs) at a non-inverting output terminal thereof and a voltage $V_{CMAO}-Via/2$ at an inverting output terminal thereof (output terminal with a circle). A difference voltage between these differential outputs is given as follows: $(V_{CMAO}+Via/2)-(V_{CMAO}-Via/2)=Via$ (with a gain of the first preamplifier circuit 2 being set to 1).

The second preamplifier circuit 22 differentially receives the input signal voltage $Vin=V_{CMB}+(Vin-VB)/2$ at a non-inverting input terminal thereof and receives a voltage $VB=V_{CMB}-(Vin-VB)/2$ at an inverting input terminal thereof (input terminal with a circle), where $V_{CMB}$ is a midpoint voltage between the input voltage Vin and the voltage VB at a tap B, and is given by $V_{CMB}+(Vin+VB)/2$. Then, the first preamplifier circuit 21 differentially outputs a voltage $V_{CMBO}+Vib/2$ (where $V_{CMBO}$ is a midpoint potential between differential outputs) at a non-inverting output terminal thereof and a voltage $V_{CMBO}-Vib/2$ at an inverting output terminal thereof (output terminal with a circle). A difference voltage between these differential outputs is given as follows: $(V_{CMBO}+Vib/2)-(V_{CMBo}-Vib/2)=Vib$ (with a gain of the second preamplifier circuit 22 being set to 1). The first and second preamplifier circuits 21 and 22 are set to have the same configuration.

The first amplifier circuit 11 differentially receives a differential signal Via ($V_{CM1I}+Via/2$, $V_{CM1I}-Via/2$) from the first preamplifier circuit 21, and differentially amplifies the received signals to output first differential signals $V_{CM1O}+Va/2$, $V_{CM1O}-Va/2$. A difference voltage between the first differential signals is given as follows: $(V_{CM1O}+Va/2)-(V_{CM1O}-Va/2)=Va$ (where a gain of the first amplifier circuit 11 is set to 1). $V_{CM1I}$ and $V_{CM1O}$ respectively are a midpoint voltage (common-mode voltage) between the differential input signals of the first amplifier circuit 11, and a midpoint voltage (common-mode voltage) between the differential output signals of the first amplifier circuit 11.

The second amplifier circuit 12 differentially receives a differential signal Vib (differential signals $V_{CM2I}+Vib/2$, $V_{CM2I}-Vib/2$) from the second preamplifier circuit 22, and differentially amplifies the received signals to output second differential signals $V_{CM2O}+Vb/2$, $V_{CM2O}-Vb/2$ (with a differential voltage Vb). A difference voltage between the second differential signals is given as follows: $(V_{CM2O}+Vb/2)-(V_{CM2O}-Vb/2)=Vb$ (with a gain of the second amplifier circuit 12 being set to 1). $V_{CM2I}$ and $V_{CM2O}$ respectively are a midpoint voltage (common-mode voltage) between the differential input signals of the second amplifier circuit 12, and a midpoint voltage (common-mode voltage) between the differential output signals of the second amplifier circuit 12.

The third amplifier circuit 13 differentially receives the non-inverting output $V_{CM1O}+Va/2$ from the first amplifier circuit 11 and the inverting output (signal from the output with a circle) $V_{CM2O}-Vb/2$ from the second amplifier circuit 12 (with a differential voltage (Va+Vb)/2, and differentially amplifies the received signals to output differential signals $V_{CM3O}+Va/2$, $V_{CM3O}-Vb/2$. A difference voltage between the differential outputs is given as follows: $(V_{CM3O}+Va/2)-(V_{CM3O}-Vb/2)=(Va+Vb)/2$ with a gain of the third amplifier circuit 13 being set to 1). $V_{CM3O}$ is a midpoint voltage (common-mode voltage) between the differential output signals of the third amplifier circuit 13. Since the third amplifier circuit 13 outputs an intermediate voltage obtained by interpolating the voltages Va and Vb (internal division at an internal division ratio of 1:1), the third amplifier circuit 13 is referred to as the "interpolating amplifier circuit". The first amplifier circuit 11, the second amplifier circuit 12, and the third amplifier circuit 13 are set to have the same configuration to one another.

FIG. 2 shows the one-bit A/D converter 10 in the first stage in FIG. 1. As shown in FIG. 1, the first amplifier circuit 11 and the second amplifier circuit 12 of each one-bit A/D converter 10 in each stage after a second stage differentially receive a first differential output Voa from a first differential output terminal and a second differential output Vob from a second differential output terminal in the selector 16 of the one-bit A/D converter 10, respectively, in the immediately preceding stage.

The comparator 14 outputs a High/Low level as an output ADOUT, which is a logic value signal, according to a polarity of the difference voltage Vc between the differential signals from the third amplifier circuit 13.

The selector 16 includes first, second, and third differential inputs that respectively receive the differential output Va of the first amplifier circuit 11, the differential output Vb of the second amplifier circuit 12, and the differential output Vc of the third amplifier circuit 13, and the first differential output Voa and the second differential output Vob. When the output ADOUT of the comparator 14 assumes a first logic value (e.g., Low), the selector 16 straightly connects the third differential input to the first differential output, and straightly connects the second differential input to the second differential output. When the output ADOUT of the comparator 14 assumes a second logic value (e.g., High), the selector cross-connects the first differential input to the second differential output, and cross-connects the third differential input to the first differential output.

Figure 3A:
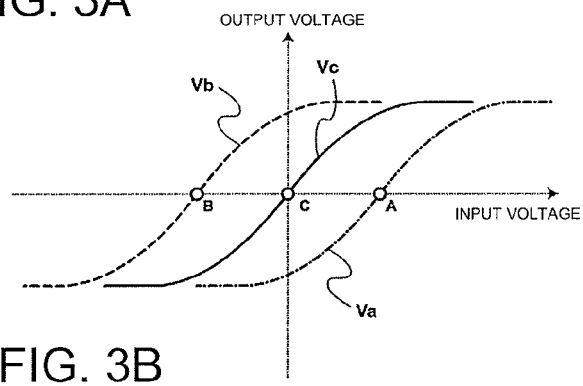
FIGS. 3A to 3C are graphs explaining DC transfer characteristics and an output ADOUT of a comparator of the one-bit A/D converter in the first example.
Figure 3B:
Figure 11A:
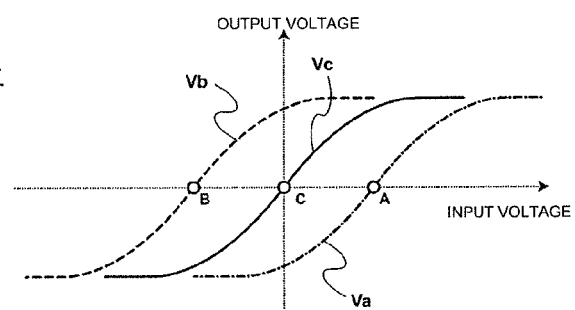
FIGS. 11A to 11C are graphs explaining DC transfer characteristics.
Figure 11B:
Figure 11C:
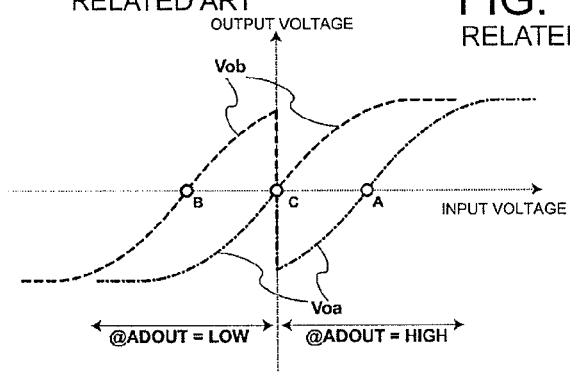

FIG. 3A illustrates input-output transfer characteristics in the first example, and FIG. 3B illustrates an overview of the output ADOUT of the comparator (comparator). FIGS. 3A and 3B are the same as FIGS. 11A and 11B.

Figure 11D:
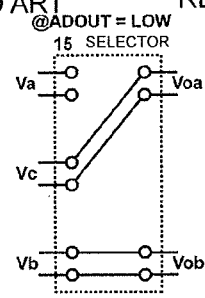
FIGS. 11D and 11E are diagrams explaining operation of a selector of the one-bit A/D converter in FIG. 10.
Figure 11E:
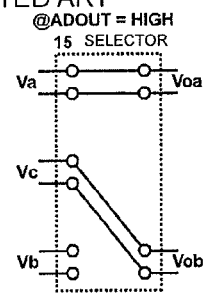

FIGS. 3D and 3E are diagrams explaining operation of the selector 16 in FIG. 2. As shown in FIGS. 3A and 3B, at a point C where the output voltage Vc of the third amplifier circuit 13 in FIG. 2 varies from a negative value to a positive value, the output ADOUT of the comparator 14 changes from Low to High. Referring to FIG. 3D, when the output ADOUT is Low, the selector 16 provides the outputs Vc and Vb as the first differential output Voa and the second differential output Vob, as with the selector 15 in FIG. 11D. When the output ADOUT is High, the selector 16 cross-connects the output Vc to the output Voa and cross-connects the output Va to the output Vob, as shown in FIG. 3E. That is, the selector 16 performs cross connection such that a non-inverting signal of the differential output Vc of the third amplifier circuit 13 is output as an inverting signal of the first differential output Voa of the selector 16 and an inverting signal of the differential output Vc of the third amplifier circuit 13 is output as a non-inverting signal of the first differential output Voa of the selector 16. The selector 16 performs cross connection such that a non-inverting signal of the differential output Va of the first amplifier circuit 11 is output as an inverting signal of the second differential output Vob of the selector 16 and an inverting signal of the differential output Va of the first amplifier circuit 11 is output as a non-inverting signal of the second differential output Vob of the selector 16. That is, when the output ADOUT is High, the signal obtained by inverting the differential output Vc is output as the first differential output Voa of the selector 16, and the signal obtained by inverting the differential output Va is output as the second differential output Vob of the selector 16.

Figure 3C:
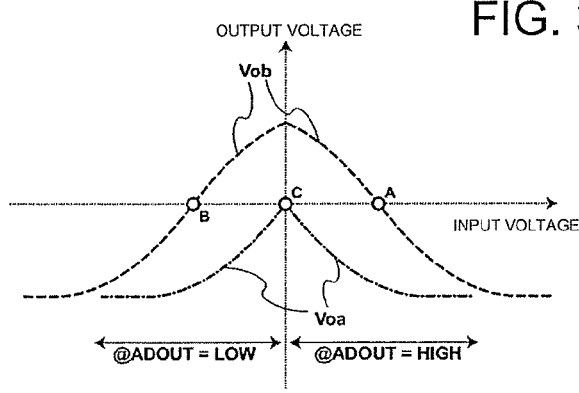
Figure 3D:
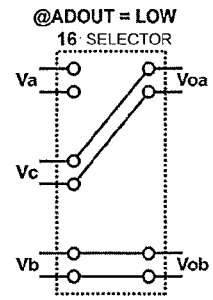
FIGS. 3D and 3E are diagrams explaining a selector circuit.
Figure 3E:
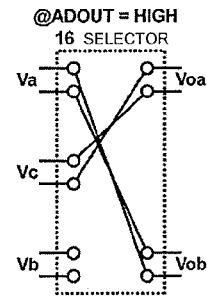

By setting signal selection of the selector 16 as described above in this example, it is possible to obtain a DC transfer characteristic, as shown in FIG. 3C, where the DC transfer characteristic is folded at the zero-cross point C (where switching of Low/High of the output ADOUT is made) as a center. Referring to FIG. 3C, an X axis indicates an input voltage, while a Y axis indicates output voltages (outputs Voa and Vob of the selector).

When the output Vc of the third amplifier circuit 13 is less than 0, the output ADOUT is Low, so that the output Vc in FIG. 3A is output as the first differential output Voa of the selector 16. When the output Vc is greater than or equal to 0, the output ADOUT is High, so that the signal obtained by inverting the polarity of the output Vc from the point C to a point A in FIG. 3A is output, as the first differential output Voa of the selector 16. For this reason, the DC transfer characteristic of the first differential output Voa of the selector 16 with respect to the input voltage becomes line-symmetrical relative to the Y axis passing through the point C (the midpoint C between the points A and B is the top of a mountain shape (triangular wave shape)).

Figures 12A, 12B, 12C, 12D, 12E, 12F, 12G:
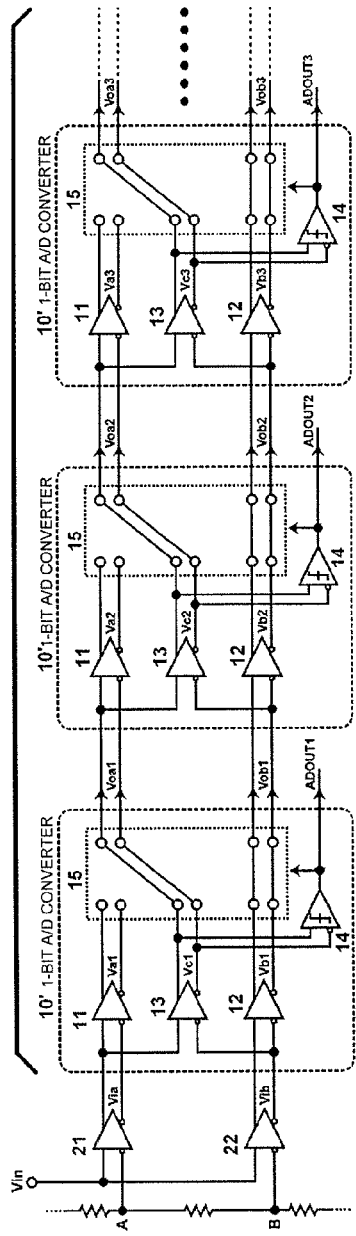
FIG. 12A is the diagram illustrating the configuration of the A/D conversion circuit in FIG. 9, and FIGS. 12B to 12G are graphs showing DC transfer characteristics and an output of a comparator in each stage.
Figure 13:
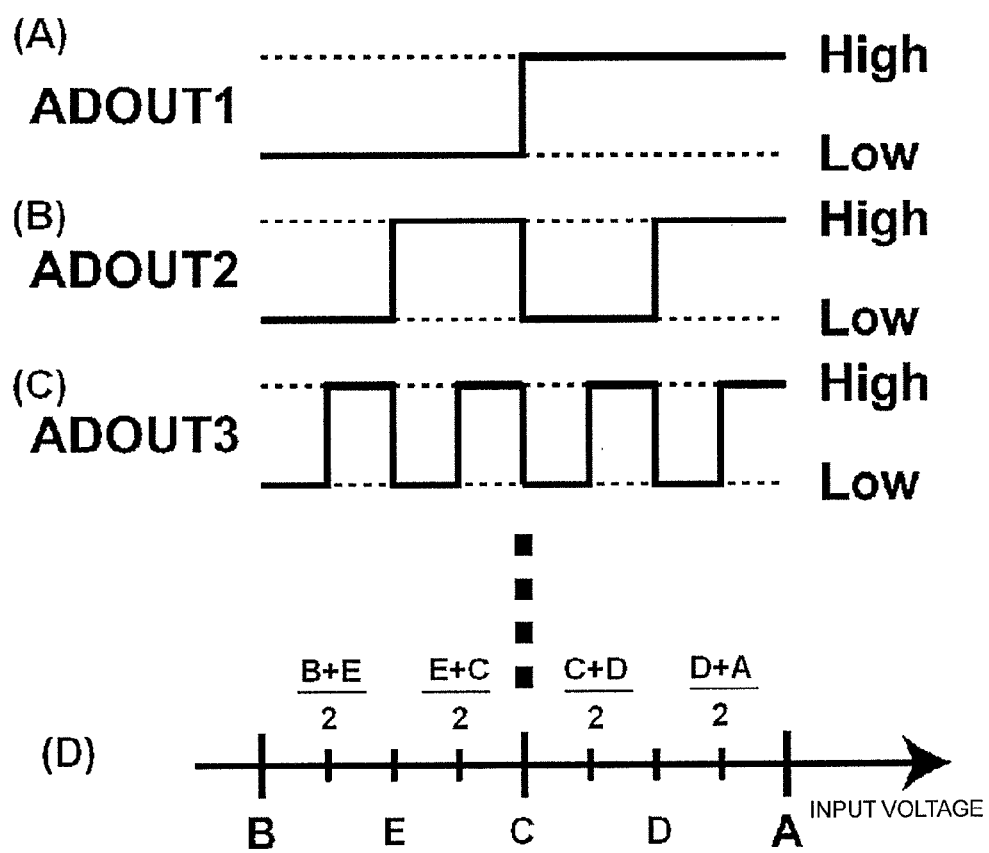
FIG. 13 (A) to (D) are diagrams explaining an A/D conversion output of the A/D conversion circuit in FIG. 9.

When the output Vc of the third amplifier circuit 13 is less than 0, the output ADOUT is Low, so that the output Vb in FIG. 3A is output as the second differential output Vob of the selector 16. When the output Vc is greater than or equal to 0, the output ADOUT is High, so that the signal obtained by inverting the polarity of the output Va from the point C to the point A in FIG. 3A is output, as the second differential output Vob of the selector 16. For this reason, the DC transfer characteristic of the second differential output Vob of the selector 16 with respect to the input voltage becomes line-symmetrical relative to the Y axis passing through the point C (the point C is the top of a mountain shape). When the value of the output of $-Va$ obtained by inverting the polarity of the value of the output Va at the point C ($<0$) in FIG. 3A is different from the value of the output Vb at the point C in FIG. 3A, a slight gap (step portion) occurs in the output Vob between the plus and minus sides of the point C. However, the value of the output of $-Va$ and the value of the output Vb are both positive at the point C. Thus, the discontinuity at the point C as shown in FIG. 12D does not occur.

By cascade-connecting N stages of the one-bit A/D converters 10 having such folding DC transfer characteristics as shown in FIG. 1, an N-bit A/D conversion circuit as a whole can be formed. In this case, the DC transfer characteristic of each output voltage in each stage of a triangular wave shape having no break in continuity can be obtained, as shown in FIGS. 4D and 4F.

FIG. 4D is a graph illustrating DC transfer characteristics of a differential output Va2 of the first amplifier circuit 11, a differential output Vb2 of the second amplifier circuit 12, and a differential output Vc2 of the third amplifier circuit 13 in the one-bit A/D converter 10 in the second stage in FIG. 4A, with respect to the input voltage. The outputs Va2 and Vb2 in FIG. 4D are respectively associated with the outputs Voa and Vob in FIG. 3C. Respective characteristics of the outputs Va2 and Vb2 in FIG. 4D are set to be left-right symmetrical relative to the point C. An output indicated by reference symbol Vc2 in FIG. 4D has an intermediate value between the outputs Va2 and Vb2, and the DC transfer characteristic of the output Vc2 is set to be left-right symmetrical relative to the point C.

FIG. 4F is a graph showing DC transfer characteristics of a differential output Va3 of the first amplifier circuit 11, a differential output Vb3 of the second amplifier circuit 12, and a differential output Vc3 of the third amplifier circuit 13 in the one-bit A/D converter 10 in a third stage in FIG. 4A, with respect to the input voltage. The outputs Va3 and Vb3 in FIG. 4F are respectively associated with inputs Voa2 and Vob2 in FIG. 4A. The differential input Voa2 of the first amplifier circuit 11 of the one-bit A/D converter 10 in the third stage is:
Vc2 when the output ADOUT2 is Low (Vc2<0); and
Vc2 when the output ADOUT2 is High (Vc2>=0).
The differential output Va3 of the first amplifier circuit 11 of the one-bit A/D converter 10 in the third stage is:
Vc2, if the input voltage is less than or equal to a voltage at a point E(=(B+C)/2) (when ADOUT2=Low);
$-Vc2$, if the input voltage is in a segment between E and C (when ADOUT 2=High);
$-Vc2$, if the input voltage is in a segment between C and D (=(C+A)/2) (if ADOUT2=High); and
Vc2, if the input voltage is greater than or equal to a voltage at a point D (if AOUT2=Low).

Accordingly, the differential output Va3 is:
line-symmetrical relative to a Y axis passing through the midpoint E between a point B and the point C (point E is the top of a mountain shape of the output Va3), if the input voltage is in a voltage range (segment) between B and C;
line-symmetrical relative to the Y axis passing through the midpoint C between the points E and D (point C is the bottom of a valley shape of the output Va3), if the input voltage is in a voltage range (segment) between E and D; and
line-symmetrical relative to a Y axis passing through the midpoint D between the point C and a point A (point D is the top of a mountain shape of the output Va3), if the input voltage is in a voltage range (segment) between C and A.

The differential input Vob2 of the second amplifier circuit 12 of the one-bit A/D converter 10 in the third stage is:
Vb2, when the output ADOUT2 is Low (Vc2<0); and
$-Va2$, when the output ADOUT2 is High (Vc2>=0).
The differential output Vb3 of the second amplifier circuit 12 of the one-bit A/D converter 10 in the third stage is:
Vb2, if the input voltage is less than or equal to the voltage at the point E (ADOUT2=Low);
$-Va2$, if the input voltage is in the voltage range (segment) between E and C (ADOUT 2=High);
$-Va2$, if the input voltage is in the voltage range (segment) between C and D (ADOUT 2=High); and
Vb2, if the input voltage is greater than or equal to the voltage at the point D (AOUT2=Low).
Accordingly, the differential output Vb3 is:
line-symmetrical relative to the Y axis passing through the midpoint E between the points B and C (point E is the top of a mountain shape of the output Vb3), if the input voltage is in the voltage range (segment) between B and C;
line-symmetrical relative to the Y axis passing through the midpoint C between the points E and D (point C is the bottom of a valley shape of the output Vb3), if the input voltage is in the voltage range (segment) between E and D; and
line-symmetrical relative to the Y axis passing through the midpoint D between the points C and A (point D is the top of a mountain shape of the output Vb3), if the input voltage is in the voltage range (segment) between C and A.

The differential output Vc3 of the third amplifier circuit 13 of the one-bit A/D converter 10 in the third stage has an intermediate value between the outputs Va3 and Vb3, and is:
line-symmetrical relative to the Y axis passing through the midpoint E between the points B and C (point E is the top of a mountain shape of the output Vc3), if the input voltage is in the voltage range (segment) between B and C;
line-symmetrical relative to the Y axis passing through the midpoint C between the points E and D (point C is the bottom of a valley shape of the output Vc3), if the input voltage is in the voltage range (segment) between E and D; and
line-symmetrical relative to the Y axis passing through the midpoint D between the points C and A (point D is the top of a mountain shape of the output Vc3), if the input voltage is in the voltage range (segment) between C and A.

Focusing an output voltage Vcn (n=1, 2, 3) of each stage, the output voltage Vcn has the DC transfer characteristic such that zero-cross points of the output voltage Vcn equally divide a segment A–B just by N powers of 2, while the DC transfer characteristic of the output voltage Vcn is different from that of the related art. Then, by determining a polarity of the output voltage Vcn by the comparator 14, A/D conversion results of N bits as shown in FIG. 5 (A) to (D) can be output. In FIGS. 5, (A), (B) and (C) illustrates timing wave forms of ADOUT1, ADOUT2, and ADOUT3 of the one-bit A/D converters 10, respectively, and (D) represent the input voltage.

Following describes codes of digital signals ADOUT1, ADOUT2, and ADOUT3 of three bits in case N=3 and the input voltage segment A–B is divided by $2^3=8$. It is assumed that the point D is the midpoint between points A and C (D=(A+C)/2), and that the point E is the midpoint between the points B and C (E=(B+C)/2). Then, the following codes are obtained:

(1) (ADOUT1, ADOUT2, ADOUT3)=(1, 0, 0), if the input voltage Vin is greater than or equal to a voltage at a point (A+D)/2;
(2) (ADOUT1, ADOUT2, ADOUT3)=(1, 0, 1), if the input voltage Vin is in a voltage segment [D, (A+D)/2];
(3) (ADOUT1, ADOUT2, ADOUT3)=(1, 1, 1), if the input voltage Vin is in a voltage segment [(C+D)/2, D] between the point D and the midpoint between the points C and D;
(4) (ADOUT1, ADOUT2, ADOUT3)=(1, 1, 0), if the input voltage Vin is in a voltage segment [C, (C+D)/2];
(5) (ADOUT1, ADOUT2, ADOUT3)=(0, 1, 0), if the input voltage Vin is in a voltage segment [(E+C)/2, C];
(6) (ADOUT1, ADOUT2, ADOUT3)=(0, 1, 1), if the input voltage Vin is in a voltage segment [E, (E+C)/2];
(7) (ADOUT1, ADOUT2, ADOUT3)=(0, 0, 1), if the input voltage Vin is in a voltage segment [(B+E)/2, E]; and
(8) (ADOUT1, ADOUT2, ADOUT3)=(0, 0, 0), if the input voltage Vin is less than or equal to a voltage at a point (B+E)/2.

Outputs of (ADOUT1, ADOUT2, ADOUT3) of a gray code where a plurality of bits do not switch at a same time (only one bit changes) are obtained. Thus, even if the N-bit A/D conversion circuit is operated at high speed, the N-bit A/D conversion circuit can be operated stably. The gray code may be of course converted to a normal binary code, for use as a digital code.

Figure 6:
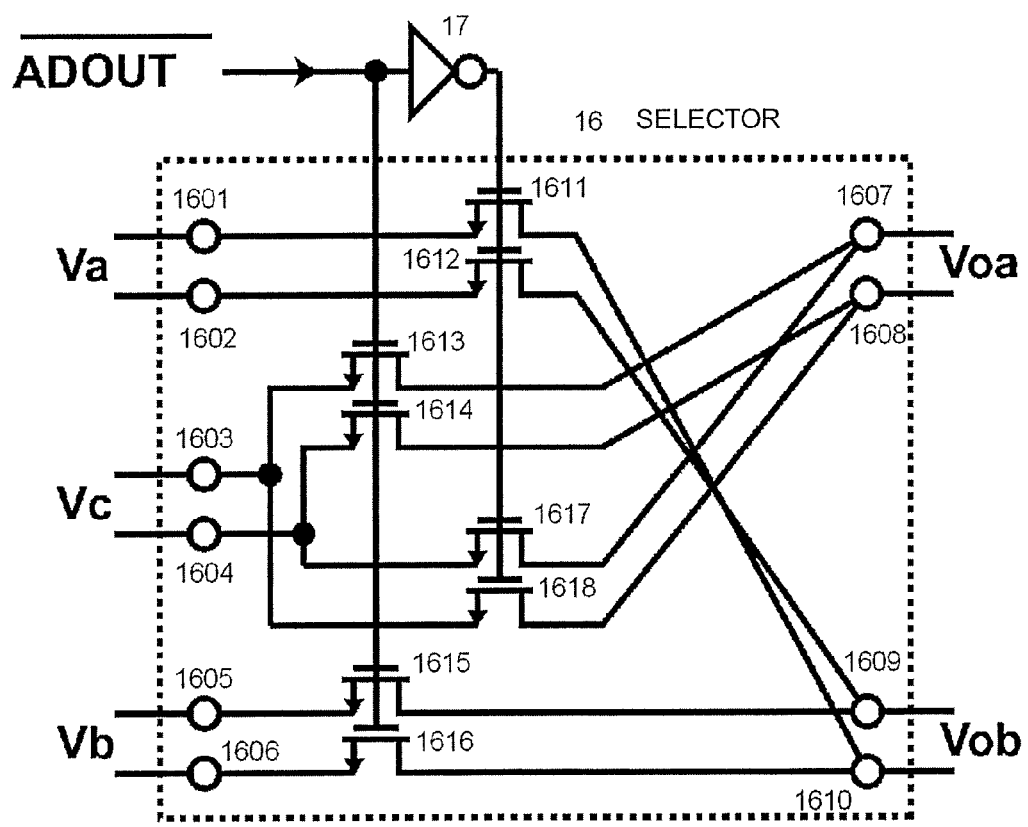
FIG. 6 is a diagram illustrating a configuration of a selector in the first example.

FIG. 6 is a diagram illustrating a configuration of the selector in this example described with reference to FIGS. 1 and 2. Referring to FIG. 6, the selector 16 includes: nMOS transistors 1611 and 1612, respectively connected between a non-inverting terminal 1601 and an inverting terminal 1610 and between an inverting terminal 1602 and a non-inverting terminal 1609, the non-inverting terminal 1601 and the inverting terminal 1602 differentially receiving the output Va, and the inverting terminal 1610 and the non-inverting terminal 1609 differentially outputting the output Vob;

nMOS transistors 1613 and 1618 respectively connected between a non-inverting terminal 1603 and a non-inverting terminal 1607 and between the non-inverting terminal 1603 and an inverting terminal 1608, the non-inverting terminal 1603 differentially receiving the output Vc, and the non-inverting terminal 1607 and the inverting terminal 1608 differentially outputting the output Voa;

nMOS transistors 1617 and 1614 respectively connected between a non-inverting terminal 1604 and the non-inverting terminal 1607 and between the non-inverting terminal 1604 and the inverting terminal 1608, the non-inverting terminal 1604 differentially receiving the output Vc, and the non-inverting terminal 1607 and the inverting terminal 1608 differentially outputting the output Voa; nMOS transistors 1615 and 1616 respectively connected between a non-inverting terminal 1605 and the non-inverting terminal 1609 and between an inverting terminal 1606 and the inverting terminal 1610, the non-inverting terminal 1605 and the inverting terminal 1606 differentially receiving the output Vb and the non-inverting terminal 1609 and the inverting terminal 1610 differentially outputting the output Vob; and an inverter 17 that receives an inverted signal $\overline{\text{ADOUT}}$ of the signal ADOUT to output the signal ADOUT obtained by inversion of the inverted signal $\overline{\text{ADOUT}}$. The inverted signal of the signal ADOUT is connected to gates of the nMOS transistors 1613, 1614, 1615, and 1616, and the output of the inverter 17 (inverted signal of the inverted signal of the signal ADOUT, accordingly the signal ADOUT) is connected to gates of the nMOS transistors 1611, 1612, 1617, and 1618.

When the signal ADOUT is High, the signal $\overline{\text{ADOUT}}$ is Low. Thus, the output of the inverter 17 goes High, so that the nMOS transistors 1611, 1612, 1617, and 1618 turn on (become conducted). Then, the non-inverting terminal 1601 of the output Va is connected to the inverting terminal 1610 of the output Vob, the inverting terminal 1602 of the output Va is connected to the non-inverting terminal 1609 of the output Vob, the non-inverting terminal 1603 of the output Vc is connected to the inverting terminal 1608 of the output Voa, and the inverting terminal 1604 of the output Vc is connected to the non-inverting terminal 1607 of the output Voa, bringing about the connection state in FIG. 3E.

When the output ADOUT is Low, the signal $\overline{\text{ADOUT}}$ is High. Then, the output of the inverter 17 goes Low, and the nMOS transistors 1613, 1614, 1615, and 1616 turn on. Then, the non-inverting terminal 1603 of the output Vc is connected to the non-inverting terminal 1607 of the output Voa, the inverting terminal 1604 of the output Vc is connected to the inverting terminal 1608 of the output Voa, and the non-inverting terminal 1605 of the output Vb is connected to the non-inverting terminal 1609 of the output Vob, and the inverting terminal 1606 of the output Vc is connected to the inverting terminal 1610 of the output Vob, bringing about the connection state in FIG. 3D.

By combining simple transfer gates (pass transistors) using the MOS transistors as shown in FIG. 6, folding of the DC transfer characteristic can be achieved. When the circuit of the selector is formed of transfer gates of the MOS transistors, excess power is not needed, and the selector circuit can be implemented with a smaller area. Thus, the A/D conversion circuit that is advantageous for lower power consumption and shrinking in size can be implemented.

Figure 7:
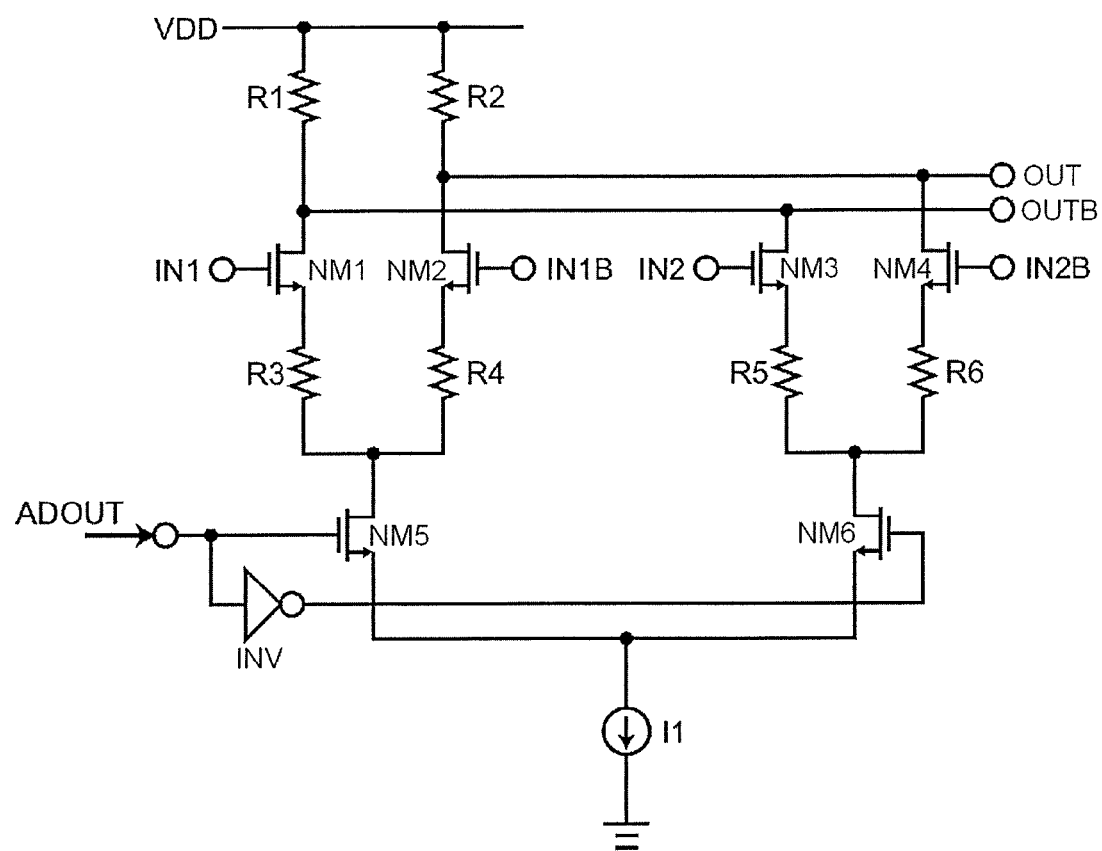
FIG. 7 is a diagram illustrating a configuration of the selector in the first example.

FIG. 7 is a diagram illustrating another configuration of the selector 15 in this example described with reference to FIGS. 1 and 2. The DC transfer characteristics can be folded also by a configuration in which signal selection is performed by switching a current source between differential amplifier circuits. In this case, increases in power and the area are essential. However, compared with the case where the selector is formed of the simple transfer gates using the MOS transistors, driving capability of a subsequent stage increases, so that a high-speed operation can be expected.

Referring to FIG. 7, the selector 15 includes: nMOS transistors NM5 and NM6 that have sources connected in common to a constant current source Il, and have gates supplied respectively with an output ADOUT and an inverted signal of the output ADOUT;

nMOS transistors NM1 and NM2 that have sources connected to a drain of the nMOS transistor NM5 through resistors R3 and R4, and have gates supplied respectively with a signal IN1 and an inverted signal IN1B of the signal IN1;

nMOS transistors NM3 and NM4 that have sources connected to a drain of the nMOS transistor NM6 through resistances R5 and R6, and have gates supplied respectively with a signal IN2 and an inverted signal IN2B of the signal IN2; a resistor R1 connected between a power supply VDD and coupled drains of the nMOS transistors NM1 and NM3; and a resistor R2 connected between the power supply VDD and coupled drains of the nMOS transistors NM2 and NM4.

Referring to FIG. 7, when the output ADOUT is High, the nMOS transistor NM5 turns on, and the nMOS transistor NM6 turns off (becomes non-conducted), so that voltages at the drains of the nMOS transistors NM1 and NM2 that receive the signals IN1 and IN are output to terminals OUTB and OUT, respectively. On the other hand, when the output ADOUT is Low, the nMOS transistor NM6 turns on, and the nMOS transistor NM5 turns off, so that voltages at the drains of the nMOS transistors NM3 and NM4 that receive the signals IN2 and IN2B are output to the terminals OUTB and OUT, respectively.

The transistors 1611, 1612, 1615, and 1616 in FIG. 6 are substituted for the differential circuit (differential switch) in FIG. 7, and the signals IN1 and IN are connected to the terminals 1601 and 1602 to differentially receive the output Va. The signals IN2B and IN2 are connected to the terminals 1605 and 1606 to differentially receive the output Vb. The terminals OUT and OUTB are connected to the terminals 1609 and 1610 to provide the output Vob. The transistors 1613, 1614, 1617, and 1618 in FIG. 6 are substituted for the differential circuit in FIG. 7. The signals IN1 and IN in FIG. 7 are connected to the terminals 1604 and 1603 to differentially receive the output Vc. The signals IN2B and IN2 are connected to the terminals 1603 and 1604 to differentially receive the output Vc. The terminals OUT and OUTB are connected to the terminals 1607 and 1608 to provide the output Voa.

SECOND EXAMPLE

Figure 8:
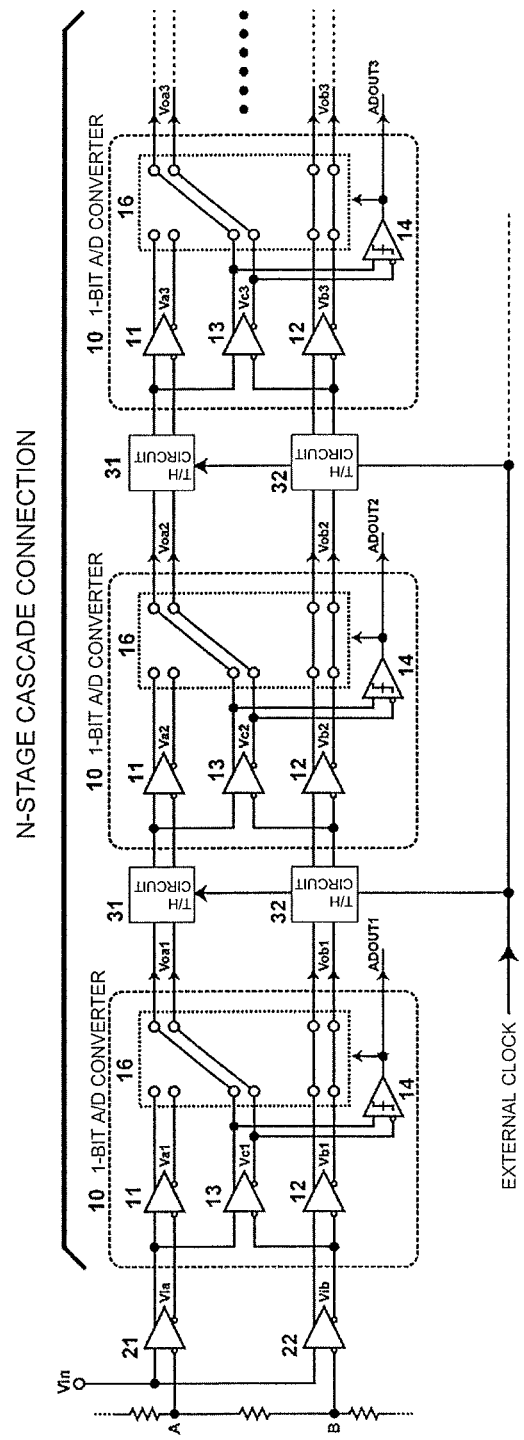
FIG. 8 is a diagram illustrating a configuration of a second example.
Figure 9:
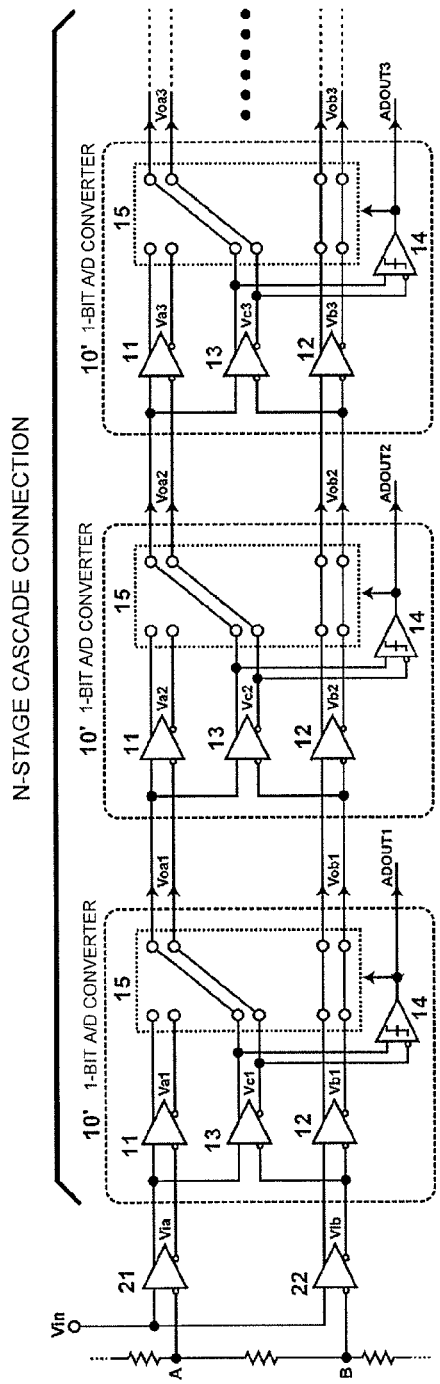
FIG. 9 is a diagram illustrating a configuration of an A/D conversion circuit (in a related art)

The following describes a second example of the disclosure. FIG. 8 is a diagram illustrating a configuration of the second example. As shown in FIG. 8, a first track and hold circuit (T/H circuit) 31 and a second track and hold circuit (T/H circuit) 32 are provided between respective stages of the cascade-connected one-bit A/D converters 10 shown in FIG. 1, and the first and second track and hold circuits 31 and 32 are synchronized with a clock signal (such as an external clock signal) to pipeline-operate the respective stages. To take an example, the first track and hold circuit (T/H circuit) 31 with differential inputs and differential outputs is provided between the first differential output terminals of the selector 16 of the one-bit A/D converter 10 in an initial stage and the differential input terminals of the first amplifier circuit of the one-bit A/D converter 10 in a first stage, and the second track and hold circuit (T/H circuit) 32 for differential inputs and differential outputs is provided between the second differential output terminals of the selector 16 of the one-bit A/D converter 10 in the initial stage and the differential input terminals of the second amplifier circuit 12 of the one-bit A/D converter 10 in the first stage. Tracking/holding of the first track and hold circuit (T/H circuit) 31 and the second track and hold circuit (T/H circuit) 32 is controlled by the common clock signal (external clock: External Clock). The first and second track and hold circuits (T/H circuits) 31 and 32 between the other stages such as between the first stage and a second stage, between the second stage and a third stage, and the like are similarly connected, and the common clock signal is supplied to the track and hold circuits (T/H circuits) between all the stages.

With this arrangement, the track and hold circuits 31 and 32 track (follow) and hold an input signal even if the input signal is has a high frequency. Accordingly, a more stable A/D conversion circuit synchronized with the clock can be implemented. The track and hold circuits (T/H circuits) 31 and 32 are set to have a same configuration. Though an internal configuration of each of the track and hold circuits (T/H circuits) 31 and 32 is not shown in FIG. 8, a known circuit or the like can be used for the track and hold circuit. As is well known, a sample and hold circuit constituted from a switch connected between an input and an output and a capacitance (capacitance for sampling) connected between the ground (GND) and a connecting point between the switch and the output may be used for the track and hold circuit. In this sample and hold circuit, when a clock signal is High, the switch turns on to output an input voltage without alteration. When the clock signal is Low, the switch turns off to hold and output the input voltage at a point of time when the switch turns off. This sample and hold circuit may be configured so that a sampling period of time (during which the switch turns on) is set to be large and tracking is performed such that a difference between the input voltage and an output voltage becomes LSB/2. With this arrangement, sampling and measurement of a single-shot signal is also possible. Alternatively, the following configuration may be, of course, used for the track and hold circuit. That is, in the sample and hold circuit, a period of time (sampling period of time) during which the switch of the sample and hold circuit is on is set to be short and the sampling capacitance is set to be small so as to increase the bandwidth of the sample and hold circuit (however, when the sampling capacitance is set to be small, there is a case noise at a time of holding an input voltage may be a problem).

As described above, according to this example, discontinuity of a DC transfer characteristic that has become the problem in the related art can be solved, so that a stable operation can be performed. This example is effective for a high-speed operation with a severe timing in particular. A digital code resulting from this example becomes a gray code output. This example is effective for operating a CMOS logic circuit for outputting a digital code stably and at high speed.

In the selector 16 in FIGS. 1, 2, and 3D in the above-mentioned disclosure, it may be so arranged that, when the output ADOUT is Low, −Vb is output as Voa (by cross-connecting the non-inverting input of the second differential input terminals of the selector 16 that receives the output of the second amplifier circuit 12 and an inverting input of the first differential output terminals of the selector 16 and by cross-connecting the inverting input of the second differential input terminals of the selector 16 and a non-inverting output of the first differential input terminals of the selector 16 to invert a polarity of the output Vb, for output through the first differential output terminals), and −Vc is output as Vob (by cross-connecting the non-inverting input of the third differential input terminals of the selector 16 that receives the output of the third amplifier circuit 13 and an inverting input of the second differential output terminals of the selector 16 and by cross-connecting the inverting input of the third differential input terminals of the selector 16 and a non-inverting output of the second differential input terminals of the selector 16 to invert a polarity of the output Vc, for output through the second differential output terminals). It may be so arranged that, when the output ADOUT is High, Va is output as Voa (by straightly connecting the non-inverting input and the inverting input of the first differential input terminals of the selector 16 that receives the output of the first amplifier circuit 11 to an inverting input and a non-inverting input of the first differential output terminals), and Vc is output as Vob (by straightly connecting the non-inverting input and the inverting input of the third differential input terminals of the selector 16 that receives the output of the third amplifier circuit 13 to an inverting input and a non-inverting input of the second differential output terminals of the selector 16).

The A/D conversion devices described in the above-mentioned disclosure are suited to be implemented on a CMOS analog-digital-mixed semiconductor device or the like. Each A/D conversion device may be of course manufactured as an individual semiconductor device. Each disclosure of the above-mentioned Patent Documents and Nonpatent Document is incorporated herein by reference. Modifications and adjustments of the disclosures are possible within the scope of the overall disclosure (including claims) of the present invention, and based on the basic technical concept of the invention. Various combinations or selections of various disclosed elements are possible within the scope of the claims of the present invention. That is, the present invention of course includes various variations and modifications that could be made by those skilled in the art according to the overall disclosure including the claims and the technical concept.

What is claimed is:

1. An A/D conversion circuit comprising cascade-connected N stages (N being a predetermined positive integer not less than two) of one-bit A/D converters, each of the one-bit A/D converters, performing analog-to-digital conversion of an input voltage supplied thereto into one bit, the input voltage received in an initial one of the N stages of the one-bit A/D converters being amplified, output, and then sequentially transferred to subsequent ones of the N stages of the one-bit A/D converters to perform A/D conversion in each of the subsequent stages, the A/D conversion circuit performing N-bit A/D conversion as a whole, the one-bit A/D converter being configured to have a direct-current transfer characteristic folded with respect to a center voltage of the input voltage to be analog-to-digital converted, wherein the one-bit A/D converter comprises:

first and second amplifier circuits that respectively receive first and second input signals as the input analog voltage of the one-bit A/D converter;

a third amplifier circuit that receives an intermediate value between the first input signal and the second input signal;

a comparator that receives an output of the third amplifier circuit to output a binary signal according to a polarity of the output of the third amplifier circuit; and a selector that selects a first set of two outputs comprising the output of the third amplifier circuit and one of outputs of the first and second amplifier circuits, or a second set of two outputs comprising the output of the third amplifier circuit and the other of the outputs of the first and second amplifier circuits, from among the three outputs of the first to third amplifier circuits, using the output of the comparator as a selection control signal and outputs the two outputs of the selected set, as first and second output signals, the first and second output signals output from the selector being supplied to the one-bit A/D converter in a subsequent one of the N stages as first and second input signals;

the selector inverting polarities of the two outputs of one of the first and second sets to output the two outputs having the polarity inverted, such that the direct-current transfer characteristic of the one-bit A/D converter is symmetrically folded with respect to the intermediate value between the first input signal and the second input signal.

2. The A/D conversion circuit according to claim 1, wherein the selector of the one-bit A/D converter respectively selects the outputs of the third and second amplifier circuits, as the first and second output signals when the output of the comparator assumes a first value, and the selector respectively selects signals obtained by inverting the polarities of the outputs of the third and first amplifier circuits as the first and second output signals when the output of the comparator assumes a second value.

3. The A/D conversion circuit according to claim 1, wherein respective polarities of the first and second output signals of the one-bit A/D converter remain unchanged, in the vicinity of the center voltage of the input voltage, irrespective of whether the input voltage is higher or lower than the center voltage, and an output of the comparator in the one-bit A/D converter in a subsequent one of the N stages of the one-bit A/D converters, which receives the output of the third amplifier circuit, is set to be same without changing a value of the output of the comparator with the center voltage of the input voltage as a border.

4. The A/D conversion circuit according to claim 1, wherein the selector comprises transfer gates each including an MOS transistor.

5. The A/D conversion circuit according to claims 1, wherein the selector comprises:

first to third input terminals that respectively receive the outputs of the first to third amplifier circuits;

first and second output terminals that respectively output the first output signal and the second output signal;

first and second switches respectively inserted between the first input terminal and the second output terminal and between the second input terminal and the second output terminal; and third and fourth switches respectively inserted between the first output terminal and one of two input nodes obtained by branching from the third input terminal into the two nodes and between the first output terminal and the other of the two input nodes, wherein turning on and off of the first and second switches are complementarily controlled by the selection control signal and an inverted signal of the selection control signal, turning on and off of the third and fourth switches are complementarily controlled by the selection control signal and the inverted signal of the selection control signal, when the selection control signal assumes the first value, the second and fourth switches turn on and the first and third switches turn off and the outputs of the third and second amplifier circuits are respectively output from the first and second output terminals as the first and second output signals, and when the selection control signal assumes the second value, the first and third switches turn on and the second and fourth switches turn off, and a signal obtained by inverting the polarity of the output of the third amplifier circuit and a signal obtained by inverting the polarity of the output of the first amplifier circuit are respectively output from the first and second output terminals, as the first and second output signals.

6. The A/D conversion circuit according to claim 1, wherein the selector comprises a differential circuit including a plurality of stages of differential pairs cascoded between power supplies, and switches turning on and off of a current path of each differential pair by the selection control signal.

7. The A/D conversion circuit according to claim 1, wherein the selector comprises:
first differential pair transistors having sources coupled in common to a current source connected to a first power supply, and having gates respectively receiving the selection control signal that is the output of the comparator and a complementary signal of the selection control signal;
second differential pair transistors having sources connected in common to a first output of the first differential pair transistors, and having gate respectively receiving the first input signal and a complementary signal of the first input signal; and
third differential pair transistors having sources connected in common to a second output of the first differential pair transistors, and having gate respectively receiving the second input signal and a complementary signal of the second input signal,
first outputs of differential outputs of the second and third differential pair transistors being connected to a second power supply through a first resistance element and output to one of differential output terminals,
second outputs of the differential outputs of the second and third differential pair transistors being connected to the second power supply through a second resistance element and output to the other of the differential output terminals.

8. The A/D conversion circuit according to claim 1, comprising:
a track and hold circuit arranged between each output of the one-bit A/D converter in one of the N stages and an input of the one-bit A/D converter in a subsequent one of the N stages, track and hold operations of the track and hold circuit being controlled by a clock signal;
each of the cascaded one-bit A/D converters in each of the plurality of stages being pipeline-operated.

9. A semiconductor device comprising:
the A/D conversion circuit as set forth in claim 1.

10. An A/D conversion circuit comprising:
one-bit A/D converters cascade-connected in a plurality of stages,
each of the one-bit A/D converters comprising:
first to third differential amplifier circuits;
a comparator that receives differential output signals of the third differential amplifier circuit and outputs a binary signal, based on a value of the differential output signals; and
a selector including fist and second differential output terminals and first to third differential input terminals that differentially receive differential output signals of the first and second amplifier circuits and the differential output signals of the third amplifier circuit, respectively,
the selector respectively connecting non-inverting and inverting terminals of the third differential input terminals to non-inverting and inverting terminals of the first differential output terminals, and
respectively connecting non-inverting and inverting terminals of the second differential input terminals to non-inverting and inverting terminals of the second differential output terminals, when the output of the comparator assumes a first value, while
the selector respectively connecting the inverting and non-inverting terminals of the third differential input terminals to the non-inverting and inverting terminals of the first differential output terminals, and respectively connecting inverting and non-inverting terminals of the first differential input terminals to the non-inverting and inverting terminals of the second differential output terminals, when the output of the comparator assumes a second value,
the first and second differential amplifier circuits of the one-bit A/D converter in one of the stages respectively receiving differential signals from the first and second differential output terminals of the selector of the one-bit A/D converter in an immediately preceding one of the stages,
the third differential amplifier circuit of the one-bit A/D converter in the one of the stages differentially receiving a signal at the non-inverting terminal of the first differential output terminals of the selector of the one-bit A/D converter in the immediately preceding one of the stages and a signal at the inverting terminal of the second differential output terminals of the selector of the one-bit A/D converter in the immediately preceding one of the stages,
the first and second differential amplifier circuits in the one-bit A/D converter in an initial one of the stages differentially receiving differential output signals from differential output terminals of first and second preamplifier circuits, respectively,
the third differential amplifier circuit of the one-bit A/D converter in the initial one of the stages differentially receiving a signal at a non-inverting terminal of the differential output terminals of the first preamplifier circuit and a signal at an inverting terminal of the differential output terminals of the second preamplifier circuit,
the first preamplifier circuit differentially receiving an input signal and a first reference signal,
the second preamplifier circuit differentially receiving the input signal and a second reference signal having a potential different from a potential of the first reference signal,
output signals of the comparators of the plurality of stages of one-bit A/D converters being set to an A/D conversion result.

11. The A/D conversion circuit according to claim 10, comprising:
first and second track and hold circuits that respectively receive and hold signals at the first and second differential output terminals of the selector of the one-bit A/D converter in one of the stages, for transfer to the one-bit A/D converter in a subsequent one of the stages when a clock signal assumes a first value.

12. The A/D conversion circuit according to claim 10, wherein the selector comprises:
first and second pass transistors respectively inserted between the non-inverting terminal of the first differential input terminals and the inverting terminal of the second differential output terminals and between the inverting terminal of the first differential input terminals and the non-inverting terminal of the second differential output terminals, turning on and off of the first and second pass transistors being controlled in common by the output signal of the comparator;
third and fourth pass transistors respectively inserted between the non-inverting terminal of the second differential input terminals and the non-inverting terminal of the second differential output terminals and between the inverting terminal of the second differential input terminals and the inverting terminal of the second differential input terminals, turning on and off of the third and fourth pass transistors being controlled in common by an inverted signal of the output signal of the comparator;

fifth and sixth pass transistors respectively inserted between the non-inverting terminal of the third differential input terminals and the non-inverting terminal of the first differential output terminals and between the inverting terminal of the third differential input terminals and the inverting terminal of the first differential output terminals, turning on and off of the fifth and sixth pass transistors being controlled in common by the inverted signal of the output signal of the comparator; and seventh and eighth pass transistors respectively inserted between the inverting terminal of the third differential input terminals and the non-inverting terminal of the first differential output terminals and between the non-inverting terminal of the third differential input terminals and the inverting terminal of the first differential output terminals, turning on and off of the seventh and eighth pass transistors being controlled in common by the output signal of the comparator.

13. The A/D conversion circuit according to claim 10, wherein the selector comprises:

a first differential pair having sources connected in common to a current source, the first differential pair differentially receiving a selection control signal; and second and third differential pairs having sources connected to differential outputs of the first differential pair, the second and third differential pairs differentially receive input first and second differential signals, differential outputs of each of the second and third differential pairs being connected to a power supply through resistance elements.

14. A semiconductor device comprising:

the A/D conversion circuit as set forth in claim 10.

* * * * *

UNITED STATES PATENT AND TRADEMARK OFFICE
CERTIFICATE OF CORRECTION

PATENT NO.         : 8,674,869 B2                                Page 1 of 1
APPLICATION NO.    : 13/574513
DATED              : March 18, 2014
INVENTOR(S)        : Hidemi Noguchi It is certified that error appears in the above-identified patent and that said Letters Patent is hereby corrected as shown below:

In the Specification

Column 2, Line 55: Delete "$V_{CMBo}$" and insert -- $V_{CMBO}$ --

Column 2, Line 56: Delete "($V_{CMBo}$" and insert -- ($V_{CMBO}$ --

Column 2, Line 57: Delete "($V_{CMBo}$" and insert -- ($V_{CMBO}$ --

Column 21, Line 11: Delete "IN" and insert -- IN1B --

Column 21, Line 21: Delete "IN" and insert -- IN1B --

Column 21, Line 28: Delete "IN" and insert -- IN1B --

Signed and Sealed this
Eighteenth Day of November, 2014

Michelle K. Lee
*Deputy Director of the United States Patent and Trademark Office*